(12) United States Patent
Matsutani et al.

(10) Patent No.: US 8,426,985 B2
(45) Date of Patent: Apr. 23, 2013

(54) POSITIVE-TYPE PHOTOSENSITIVE RESIN COMPOSITION, METHOD FOR PRODUCING RESIST PATTERN, AND ELECTRONIC COMPONENT

(75) Inventors: Hiroshi Matsutani, Hitachi (JP); Takumi Ueno, Hitachi (JP); Alexandre Nicolas, Hitachi (JP); Ken Nanaumi, Chikusei (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 13/060,763

(22) PCT Filed: Sep. 2, 2009

(86) PCT No.: PCT/JP2009/065336
§ 371 (c)(1),
(2), (4) Date: May 13, 2011

(87) PCT Pub. No.: WO2010/026988
PCT Pub. Date: Mar. 11, 2010

(65) Prior Publication Data
US 2011/0204528 A1     Aug. 25, 2011

(30) Foreign Application Priority Data
Sep. 4, 2008 (JP) ................ P2008-227182

(51) Int. Cl.
*H01L 23/52* (2006.01)
*H01L 23/48* (2006.01)
*H01L 29/40* (2006.01)

(52) U.S. Cl.
USPC ........... 257/786; 257/E23.116; 257/787; 257/798; 430/270.1; 430/273.1; 438/612

(58) Field of Classification Search ........... 257/E23.002, 257/E23.116, 750, 781, 786, 787, 798; 430/270.1, 430/273.1, 311–314, 317, 326; 438/612, 438/666
See application file for complete search history.

(56) References Cited

U.S. PATENT DOCUMENTS
3,957,512 A     5/1976  Kleeberg et al.
5,368,977 A  *  11/1994  Yoda et al. ............... 430/190
(Continued)

FOREIGN PATENT DOCUMENTS
EP     0 087 262      8/1983
EP     2 221 666      8/2010
(Continued)

OTHER PUBLICATIONS

J. Kusunoki, et al., "Low Temperature Curable Photosensitive Dielectric Materials for WLP Applications", *Journal of Photopolymer Science and Technology*, vol. 18, No. 2, 2005, pp. 321-325.

(Continued)

*Primary Examiner* — Chris Chu
(74) *Attorney, Agent, or Firm* — Antonelli, Terry, Stout & Kraus, LLP.

(57) ABSTRACT

A positive tone photosensitive composition comprising: (A) an alkali-soluble resin having a phenolic hydroxyl group; (B) a phenol resin modified by a compound having an unsaturated hydrocarbon group containing 4 to 100 carbon atoms; (C) a compound that generates an acid by the action of light; (D) a thermal cross-linker that crosslinks the ingredient (A) and the ingredient (B) by heating; and (E) a solvent.

15 Claims, 7 Drawing Sheets

U.S. PATENT DOCUMENTS

| | | | |
|---|---|---|---|
| 6,110,646 A * | 8/2000 | Urano et al. | 430/302 |
| 6,426,173 B1 * | 7/2002 | Shimizu et al. | 430/302 |
| 6,596,457 B1 * | 7/2003 | Hidaka et al. | 430/270.1 |
| 7,198,877 B2 * | 4/2007 | Van Damme et al. | 430/166 |
| 7,214,743 B2 * | 5/2007 | Hatakeyama et al. | 525/534 |
| 7,217,499 B2 * | 5/2007 | Ozaki et al. | 430/278.1 |
| 7,476,485 B2 * | 1/2009 | Hatakeyama et al. | 430/270.1 |
| 8,088,554 B2 * | 1/2012 | Hatakeyama | 430/270.1 |
| 2010/0276186 A1 | 11/2010 | Sasaki et al. | |

FOREIGN PATENT DOCUMENTS

| | | |
|---|---|---|
| JP | 49-115541 | 11/1974 |
| JP | 59-108031 | 6/1984 |
| JP | 2004-2753 | 1/2004 |
| JP | 2004-93816 | 3/2004 |
| JP | 2004-190008 | 7/2004 |
| JP | 2006-106214 | 4/2006 |
| JP | 3812654 | 6/2006 |
| JP | 2007-79553 | 3/2007 |
| JP | 2007-316577 | 12/2007 |
| WO | WO 99/32936 | 7/1999 |
| WO | WO 2004/006020 | 1/2004 |
| WO | WO 2007/026475 | 3/2007 |
| WO | WO 2008/026406 | 3/2008 |
| WO | WO 2009/063808 | 5/2009 |

OTHER PUBLICATIONS

Y. Imai, et al., "Latest Polyimide, ~Its Basic and Application~", Jan. 28, 2002, 1$^{st}$ edition, 1$^{st}$ printing, Publisher: Takashi Yoshida, Published Office: NTS, Inc., Japan.

Communication mailed Jul. 30, 2012, in connection with European Patent Application No. 09811513.2, 11 pages, European Patent Office; Munich, Germany.

Translation of the International Preliminary Report on Patentability dated Apr. 21, 2011, for International Application No. PCT/JP2009/065336.

* cited by examiner

POSITIVE-TYPE PHOTOSENSITIVE RESIN COMPOSITION, METHOD FOR PRODUCING RESIST PATTERN, AND ELECTRONIC COMPONENT

TECHNICAL FIELD

The present invention relates to a positive tone photosensitive composition, a method for producing a resist pattern, and an electronic component.

BACKGROUND ART

In recent years, the high integration and growing in size of semiconductor devices have been promoted, and thus, it has been demanded to make thinner and smaller encapsulation resin packages. With such demands, it has been desired to form the surface-protective layers and interlayer dielectric films of semiconductor devices and the redistribution layers of semiconductor packages, using materials having more excellent electric properties, heat resistance, mechanical properties, etc. Polyimide resin is one of materials capable of satisfying such requirements, and for example, the use of photosensitive polyimide, in which photosensitive properties are imparted to a polyimide resin, has been considered. The use of such photosensitive polyimide is advantageous in that a pattern formation step is simplified and a complicated production process can be reduced (see, for example, Patent Literatures 1 and 2).

A film of polyimide resin is formed by making a thin film from a solution (what is called varnish) of a polyimide precursor (polyamic acid) obtained by reacting tetracarboxylic acid dianhydride with diamine according to a method such as spin coating, and then performing thermal dehydrative ring closure on it (see, for example, Non Patent Literature 1). A polyamide resin is hardened through such dehydrative ring closure processes.

However, the conventional polyimide resin, in which a polyimide precursor is used, is problematic in that volume shrinkage is caused by dehydration (imidation) when it is hardened, and in that the loss of a film thickness and a decrease in size precision occur. In addition, it has been recently desired to carry out a film formation process at a low temperature, and thus, it has been desired to develop a polyimide resin, in which dehydrative ring closure can be carried out at a low temperature, and in which the physical properties of a film obtained after the dehydration and the ring closure are equivalent to those of a film obtained by carrying out dehydrative ring closure at a high temperature. However, since imidation becomes insufficient if a polyimide precursor is hardened at a low temperature, the physical properties thereof are decreased such that the formed cured film becomes fragile.

On the other hand, photosensitive resins, which do not need dehydrative ring closure, differing from the polyimide precursor, and which use other polymers having high heat resistance, have been studied (see, for example, Non Patent Literature 2 and Patent Literatures 3-7). In particular, in recent years, from the viewpoint of reduction of environmental impact, it has been desired to develop a positive tone photosensitive composition, which can be developed in an alkaline aqueous solution and can form a pattern with high heat resistance, for the intended use as a redistribution layer for semiconductor packages, etc.

CITATION LIST

Patent Literature

Patent Literature 1: Japanese Patent Application Laid-Open Publication No. 49-115541
Patent Literature 2: Japanese Patent Application Laid-Open Publication No. 59-108031
Patent Literature 3: International Publication WO2004/006020
Patent Literature 4: Japanese Patent Application Laid-Open Publication No. 2006-106214
Patent Literature 5: Japanese Patent Application Laid-Open Publication No. 2004-2753
Patent Literature 6: Japanese Patent Application Laid-Open Publication No. 2004-190008
Patent Literature 7: Japanese Patent No. 3812654

Non Patent Literature

Non Patent Literature 1: "*Saishin Polyimide—Kiso to Oyo—* (Latest Polyimide—Base and Application—)," edited by Japan Polyimide Society, 2002
Non Patent Literature 2: J. Photopolym. Sci. Technol. 2005, Vol. 18, pp. 321-325

SUMMARY OF INVENTION

Technical Problem

However, it has been desired to further improve the conventional positive tone photosensitive composition, in which a polymer not requiring dehydrative ring closure is used and which can be developed in an alkaline aqueous solution, in terms of photosensitive properties such as sensitivity and resolution, and actually, the adhesion and thermal shock resistance of the formed resist pattern have not necessarily reached satisfactory levels. Moreover, it has become clear that the conventional positive tone photosensitive composition is also problematic in that cracks are easily generated in the formed resist pattern.

Hence, it is an object of the present invention to provide a positive tone photosensitive composition, which has excellent sensitivity and resolution, and which can form a resist pattern having excellent adhesion and thermal shock resistance, while sufficiently suppressing the generation of cracks, and which can be developed in an alkaline aqueous solution.

Solution to Problem

The present invention provides a positive tone photosensitive composition comprising: (A) an alkali-soluble resin having a phenolic hydroxyl group; (B) a phenol resin modified by a compound having an unsaturated hydrocarbon group containing 4 to 100 carbon atoms; (C) a compound that generates an acid by the action of light; (D) a thermal cross-linker; and (E) a solvent.

The present positive tone photosensitive composition has excellent sensitivity and resolution, and it can form a resist pattern having excellent adhesion and thermal shock resistance by development using an alkaline aqueous solution, while sufficiently suppressing the generation of cracks. The reason why such effects can be obtained by the positive tone photosensitive composition of the present invention has not been necessarily clarified, but regarding particularly sensitivity, resolution, and the adhesion and thermal shock resistance of a resist pattern, the present inventors consider as follows.

When a photosensitive resin film comprising the ingredient (A) as well as the ingredients (B) to (E) is exposed to light, the dissolution of a light-unexposed portion is inhibited by a phenolic hydroxy group contained in the ingredient (A), and at the same time, the dissolution of a light-exposed portion is promoted. As a result, it is considered that sensitivity and resolution, which are both sufficiently high, can be achieved simultaneously.

Moreover, by using a phenol resin modified by a compound having an unsaturated hydrocarbon skeleton containing 4 to 100 carbon atoms, the flexibility of a cured film is enhanced, the fracture elongation thereof is improved, and as a result, the adhesion and thermal shock resistance of a resist pattern are considered to be improved. In particular, since a vegetable oil modified phenol resin, which comprises vegetable oil as a compound having an unsaturated hydrocarbon skeleton containing 4 to 100 carbon atoms, has a large number of double bonds derived from vegetable oil, such double bonds are crosslinked by heating after development, and thus, hardening is sufficiently promoted. Accordingly, it is considered that the adhesion and thermal shock resistance of a resist pattern formed are further improved. As with the ingredient (A), the ingredient (B) is considered to contribute to the improvement of sensitivity and resolution.

The ingredient (A) is preferably a phenol resin because it is available at a low cost and its volume shrinkage is small when it is hardened. Also, the ingredient (A) is preferably a vinyl polymer containing a monomer unit having a phenolic hydroxyl group because it is excellent in terms of electric properties (insulation properties) and its volume shrinkage is small when it is hardened.

In order to further improve solubility in an alkaline aqueous solution, it is preferable that the ingredient (B) be further modified by the reaction of a phenolic hydroxyl group with a polybasic acid anhydride.

In order to further improve sensitivity and resolution during the formation of a resist pattern, and the adhesion, mechanical properties and thermal shock resistance of a resist pattern after hardening, the mass ratio between the ingredient (A) and the ingredient (B) is preferably from 5:95 to 95:5, based on the total amount of the ingredients (A) and (B) that is defined as 100.

In order to further improve sensitivity during the formation of a resist pattern, the ingredient (C) is preferably an o-quinone diazide compound.

In order to further improve resolution during the formation of a resist pattern, the positive tone photosensitive composition of the present invention preferably comprises 3 to 100 parts by mass of the ingredient (C), with respect to the total amount of the ingredients (A) and (B) that is defined as 100 parts by mass.

Preferably, the positive tone photosensitive composition of the present invention further comprises an elastomer (F). Thereby, the obtained resist pattern becomes more excellent in terms of flexibility, and as a result, the mechanical properties and thermal shock resistance of the resist pattern can be further improved.

The method for producing a resist pattern of the present invention comprises the steps of exposing a photosensitive resin film formed by drying the above described positive tone photosensitive composition according to the present invention to light; and heating the resist pattern. According to this production method, since it uses the above described positive tone photosensitive composition, it has sufficiently high sensitivity and resolution, and it can form a resist pattern having excellent adhesion and thermal shock resistance by development using an alkaline aqueous solution, while sufficiently suppressing the generation of cracks.

In the method for producing a resist pattern of the present invention, a resist pattern is preferably heated at 200° C. or less. Thereby, a resist pattern can be hardened, while sufficiently preventing electronic devices from damage caused by heat.

In another aspect, the present invention relates to an electronic component. The electronic component according to the present invention may have a resist pattern produced by the above described production method according to the present invention as an interlayer dielectric layer or a surface-protective film. The electronic component according to the present invention may have a resist pattern produced by the above described production method according to the present invention as a cover coating layer. The electronic component according to the present invention may have a resist pattern produced by the above described method for producing a resist pattern according to the present invention as a core used for a redistribution layer. The electronic component according to the present invention may have a resist pattern produced by the above described method for producing a resist pattern according to the present invention as a collar for holding a conductive ball that is an external connection terminal. The electronic component according to the present invention may have a resist pattern produced by the above described method for producing a resist pattern according to the present invention as an underfill. Since the electronic component according to the present invention may have a resist pattern formed with the positive tone photosensitive composition of the present invention, it is sufficiently excellent in terms of reliability.

Advantageous Effects of Invention

According to the present invention, there is provided a positive tone photosensitive composition, which has excellent sensitivity and resolution, and which can form a resist pattern having excellent adhesion and thermal shock resistance, while sufficiently suppressing the generation of cracks, and which can be developed in an alkaline aqueous solution. A resist pattern formed with the positive tone photosensitive composition according to the present invention has good mechanical properties. Since the positive tone photosensitive composition according to the present invention can form a resist pattern excellent in terms of mechanical properties and the like by heating at a low temperature, it can prevent electronic components from damage caused by heat, so that it can provide highly reliable electronic components at high yields.

Since the resist pattern produced by the production method according to the present invention has good shape and properties and has a small degree of volume shrinkage when it is hardened, it has high size stability.

DESCRIPTION OF EMBODIMENTS

Figure 1:
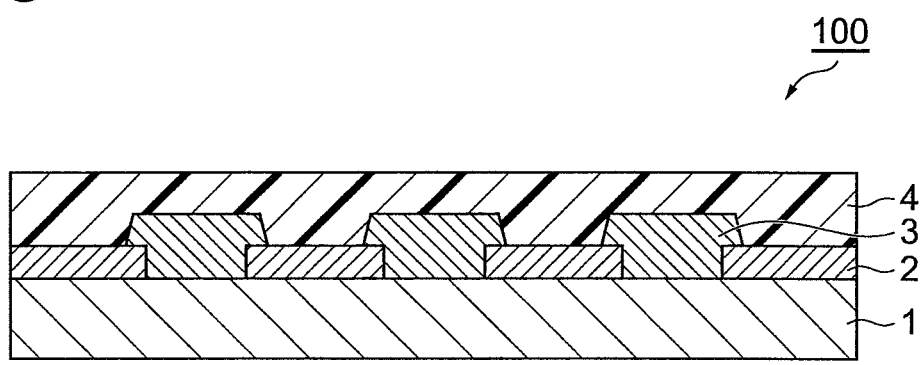
FIG. 1 is a schematic sectional view illustrating one embodiment of the production process of a semiconductor device.

Hereinafter, preferred embodiments of the present invention will be described in detail, while referring to figures, as necessary. However, the present invention is not limited to the following embodiments. In the figures, the same symbols are assigned to the same elements, and overlapping explanations are omitted. In addition, positional relationships regarding upper, lower, left and right positions are based on the positional relationships shown in the figures, unless otherwise specified. Moreover, dimensional ratios are not limited to those applied in the figures. The term "(meth)acrylate" is used in the present specification to mean "acrylate" and the corresponding "methacrylate." Likewise, the term "(meth)acryl" is used herein to mean "acryl" and the corresponding "methacryl."

Positive Tone Photosensitive Composition

The positive tone photosensitive composition according to the present embodiment comprises: (A) an alkali-soluble resin having a phenolic hydroxyl group; (B) a phenol resin modified by a compound having an unsaturated hydrocarbon group containing 4 to 100 carbon atoms; (C) a compound that generates an acid by the action of light; (D) a thermal cross-linker; and (E) a solvent.

Ingredient (A): an Alkali-Soluble Resin Having a Phenolic Hydroxyl Group

The ingredient (A) is a resin, which has a phenolic hydroxyl group in a molecule thereof and is soluble in an alkaline developing solution. The alkali-soluble resin having a phenolic hydroxyl group used as the ingredient (A) is selected from the group consisting of, for example, hydroxystyrene resins such as polyhydroxystyrene and copolymers comprising hydroxystyrene as a monomer unit, phenol resins, polybenzoxazole precursors such as poly(hydroxyamide), poly(hydroxyphenylene)ether, and polynaphthol.

Of these, a phenol resin, which is not modified by a compound having an unsaturated hydrocarbon group containing 4 to 100 carbon atoms, is preferable because of inexpensiveness and a small degree of volume shrinkage when it is hardened, and a novolac phenol resin is particularly preferable. Moreover, a hydroxystyrene resin is also preferable because of excellent electric properties (insulation properties) and a small degree of volume shrinkage when it is hardened.

A phenol resin is a polycondensation product of phenol or a derivative thereof, and an aldehyde. Polycondensation is carried out in the presence of a catalyst such as an acid or a base. The phenol resin obtained by using an acid catalyst is particularly referred to as a novolac phenol resin. Specific examples of such a novolac phenol resin include a phenol/formaldehyde novolac resin, a cresol/formaldehyde novolac resin, a xylenol/formaldehyde novolac resin, a resorcinol/formaldehyde novolac resin and a phenol-naphthol/formaldehyde novolac resin.

Examples of a phenol derivative used to obtain a phenol resin include: alkylphenols such as o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol and 3,4,5-trimethylphenol; alkoxyphenols such as methoxyphenol and 2-methoxy-4-methylphenol; alkenylphenols such as vinylphenol and allylphenol; aralkylphenols such as benzylphenol; alkoxycarbonylphenols such as methoxycarbonylphenol; arylcarbonylphenols such as benzoyloxyphenol; halogenated phenols such as chlorophenol; polyhydroxybenzenes such as catechol, resorcinol and pyrogallol; bisphenols such as bisphenol A and bisphenol F; naphthol derivatives such as α- or β-naphthol; hydroxyalkylphenols such as p-hydroxyphenyl-2-ethanol, p-hydroxyphenyl-3-propnaol and p-hydroxyphenyl-4-butanol; hydroxyalkylcresols such as hydroxyethylcresol; alcoholic hydroxyl group-containing phenol derivatives such as the monoethylene oxide adducts of bisphenols and the monopropylene oxide adducts of bisphenols; and carboxyl group-containing phenol derivatives such as p-hydroxyphenylacetic acid, p-hydroxyphenylpropionic acid, p-hydroxyphenylbutanoic acid, p-hydroxycinnamic acid, hydroxybenzoic acid, hydroxyphenylbenzoic acid, hydroxyphenoxybenzoic acid and diphenolic acid. In addition, methylol products of the above described phenol derivatives, such as bishydroxymethyl-p-cresol, may also be used as phenol derivatives.

Moreover, a phenol resin may be a product obtained by subjecting the above described phenol or phenol derivative, together with a compound other than phenol, such as m-xylene, and an aldehyde, to condensation polymerization. In this case, the molar ratio of the compound other than phenol with respect to the phenol derivative used in the condensation polymerization is preferably less than 0.5.

The above described phenol derivative and the compound other than a phenol compound are used singly or in combination of two or more types.

The aldehyde used to obtain a phenol resin is selected from among, for example, formaldehyde, acetaldehyde, furfural, benzaldehyde, hydroxybenzaldehyde, methoxybenzaldehyde, hydroxyphenylacetaldehyde, methoxyphenylacetaldehyde, crotonaldehyde, chloroacetaldehyde, chlorophenylacetaldehyde, acetone, glyceraldehyde, glyoxylic acid, methyl glyoxylate, phenyl glyoxylate, hydroxyphenyl glyoxylate, formylacetic acid, methyl formylacetate, 2-formylpropionic acid, methyl 2-formylpropionate, pyruvic acid, levulinic acid, 4-acetylbutyric acid, acetonedicarboxylic acid and 3,3'-4,4'-benzophenonetetracarboxylic acid. In addition, formaldehyde precursors such as paraformaldehyde and trioxane may be used in the reaction. These compounds may be used singly or in combination of two or more types.

As a hydroxystyrene resin, for example, a product obtained by polymerizing (vinyl polymerization) the ethylenic unsaturated double bond of hydroxystyrene, into which a protecting group has been introduced, in the presence of a catalyst (a radial initiator), and then performing deprotection, may be used. Moreover, a branched poly(hydroxystyrene) such as PHS-B (a trade name from DuPont) may also be used.

Herein, as a protecting group used for hydroxystyrene, conventionally known protecting groups such as an alkyl group and a silyl group may be used. Moreover, a vinyl group-containing monomer such as styrene, (meth)acrylic acid or (meth)acrylate may also be copolymerized with hydroxystyrene, into which a protecting group has been introduced.

If taking into consideration solubility in an alkaline aqueous solution and the balance between photosensitive properties and the physical properties of a cured film, the weight average molecular weight of the ingredient (A) is preferably 500 to 150000, more preferably 500 to 100000, and further preferably 1000 to 50000. Herein, the weight average molecular weight means a value obtained by measuring the molecular weight by a gel permeation chromatography method and then converting the obtained value based on a standard polystyrene calibration curve.

Ingredient (B): A Phenol Resin Modified by a Compound Having an Unsaturated Hydrocarbon Group Containing 4 to 100 Carbon Atoms The phenol resin modified by a compound having an unsaturated hydrocarbon group containing 4 to 100 carbon atoms is a condensation polymerization product of a reaction product (hereinafter simply referred to as an "unsaturated hydrocarbon group-modified phenol derivative") of phenol or a derivative thereof with a compound having an unsaturated hydrocarbon group containing 4 to 100 carbon atoms (hereinafter simply referred to as an "unsaturated hydrocarbon group-containing compound" in some cases) and an aldehyde, or a reaction product of a phenol resin with an unsaturated hydrocarbon group-containing compound.

As a phenol derivative, those described above as materials for the phenol resin as the ingredient (A) may be used.

From the viewpoint of the adhesion and thermal shock resistance of a resist pattern, an unsaturated hydrocarbon group contained in an unsaturated hydrocarbon group-containing compound preferably contains two or more unsaturated groups. In addition, from the viewpoint of compatibility when a resin composition is prepared and the flexibility of a cured film, the unsaturated hydrocarbon group contains preferably 8 to 80, and more preferably 10 to 60 carbon atoms.

Examples of the unsaturated hydrocarbon group-containing compound include an unsaturated hydrocarbon containing 4 to 100 carbon atoms, polybutadiene having a carboxyl group, epoxidated polybutadiene, linoleyl alcohol, oleyl alcohol, unsaturated fatty acid, and unsaturated fatty acid ester. Preferred unsaturated fatty acids include crotonic acid, myristoleic acid, palmitoleic acid, oleic acid, elaidic acid, vaccenic acid, gadoleic acid, erucic acid, nervonic acid, linoleic acid, α-linolenic acid, eleostearic acid, stearidonic acid, arachidonic acid, eicosapentaenoic acid, clupanodonic acid and docosahexaenoic acid. Of these, vegetable oil as an unsaturated fatty acid ester is particularly preferable.

Vegetable oil is an ester of glycerin and unsaturated fatty acid, which is non-drying oil having an iodine number of 100 or less, semidrying oil having an iodine number of more than 100 and less than 130, or drying oil having an iodine number of 130 or more. Examples of the non-drying oil include olive oil, morning glory seed oil, cashew nut oil, sasanqua oil, camellia oil, castor oil and peanut oil. Examples of the semidrying oil include corn oil, cottonseed oil and sesame oil. Examples of the drying oil include paulownia oil, linseed oil, soybean oil, walnut oil, safflower oil, sunflower oil, perilla oil and poppy oil. Moreover, processed vegetable oil obtained by processing these vegetable oils may also be used.

From the viewpoint of the prevention of gelation occurring with the progression of an excessive reaction and the improvement of yield ratio in the reaction of phenol or a derivative thereof or a phenol resin with vegetable oil, among the aforementioned vegetable oils, non-drying oil is preferably used. On the other hand, from the viewpoint of the improvement of adhesion, mechanical properties and thermal shock resistance of a resist pattern, drying oil is preferably used. Among such drying oils, paulownia oil, linseed oil, soybean oil, walnut oil and safflower oil are preferable because these oils can effectively and reliably exhibit the advantageous effects of the present invention, and paulownia oil and linseed oil are more preferable. These vegetable oils are used singly or in combination of two or more types.

The reaction of phenol or a derivative thereof with an unsaturated hydrocarbon group-containing compound is preferably carried out at 50° C. to 130° C. From the viewpoint of the improvement of the flexibility of a cured film (resist pattern), with regard to the reaction ratio between the phenol or the derivative thereof and the unsaturated hydrocarbon group-containing compound, preferably 1 to 100 parts by mass of, and more preferably 5 to 50 parts by mass of the unsaturated hydrocarbon group-containing compound is used with respect to 100 parts by mass of the phenol or the derivative thereof. If less than 1 part by mass of the unsaturated hydrocarbon group-containing compound is used, the flexibility of the cured film tends to decrease; if more than 100 parts by mass of the unsaturated hydrocarbon group-containing compound is used, the heat resistance of the cured film tends to decrease. In the above described reaction, p-toluenesulfonic acid, trifluoromethanesulfonic acid or the like may be used as a catalyst, as necessary.

By polycondensing an unsaturated hydrocarbon group-modified phenol derivative generated as a result of the above described reaction and an aldehyde, there is generated a phenol resin modified by an unsaturated hydrocarbon group-containing compound. The aldehyde used herein is selected from among, for example, formaldehyde, acetaldehyde, furfural, benzaldehyde, hydroxybenzaldehyde, methoxybenzaldehyde, hydroxyphenylacetaldehyde, methoxyphenylacetaldehyde, crotonaldehyde, chloroacetaldehyde, chlorophenylacetaldehyde, acetone, glyceraldehyde, glyoxylic acid, methyl glyoxylate, phenyl glyoxylate, hydroxyphenyl glyoxylate, formylacetic acid, methyl formylacetate, 2-formylpropionic acid, methyl 2-formylpropionate, pyruvic acid, levulinic acid, 4-acetylbutyric acid, acetonedicarboxylic acid and 3,3'-4,4'-benzophenonetetracarboxylic acid. In addition, formaldehyde precursors such as paraformaldehyde and trioxane may be used. These aldehydes may be used singly or in combination of two or more types.

The reaction of the above described aldehyde with the above described unsaturated hydrocarbon group-modified phenol derivative is a polycondensation reaction, and conventionally known phenol resin synthetic conditions may be applied to the reaction. The reaction is preferably carried out in the presence of a catalyst such as an acid or a base, and an acid catalyst is more preferably used. Examples of the acid catalyst include hydrochloric acid, sulfuric acid, formic acid, acetic acid, p-toluenesulfonic acid and oxalic acid. These acid catalysts may be used singly or in combination of two or more types.

It is preferable that the above described reaction be generally carried out at a reaction temperature of 100° C. to 120° C. In addition, although the reaction time is different depending on the type and amount of a catalyst used, it is generally 1 to 50 hours. After completion of the reaction, the reaction product is dehydrated under a reduced pressure at a temperature of 200° C. or less, so as to obtain a phenol resin modified by an unsaturated hydrocarbon-containing compound. It is to be noted that a solvent such as toluene, xylene or methanol may be used in the reaction.

The phenol resin modified by an unsaturated hydrocarbon group-containing compound may also be obtained by polycondensing the above described unsaturated hydrocarbon group-modified phenol derivative, together with a compound other than phenol, such as m-xylene, and an aldehyde. In this case, the molar ratio of the compound other than phenol is preferably less than 0.5, with respect to the compound obtained by reacting the phenol derivative with the unsaturated hydrocarbon group-containing compound.

The ingredient (B) can also be obtained by reacting a phenol resin with an unsaturated hydrocarbon group-containing compound. The phenol resin is a polycondensation product of a phenol derivative and an aldehyde. In this case, the same phenol derivatives and aldehydes as those described above may be used in the reaction, and the phenol resin can be synthesized under the conventionally known conditions as described above.

Specific examples of the phenol resin obtained from the phenol derivative and the aldehyde include a phenol/formaldehyde novolac resin, a cresol/formaldehyde novolac resin, a xylenol/formaldehyde novolac resin, a resorcinol/formaldehyde novolac resin and a phenol-naphthol/formaldehyde novolac resin.

As an unsaturated hydrocarbon group-containing compound allowed to react with the phenol resin, the same unsaturated hydrocarbon group-containing compounds as those described above can be used.

The reaction of the phenol resin with the unsaturated hydrocarbon group-containing compound is preferably carried out generally at 50° C. to 130° C. In addition, from the viewpoint of the improvement of the flexibility of a cured film (resist pattern), with regard to the reaction ratio between the phenol resin and the unsaturated hydrocarbon group-containing compound, preferably 1 to 100 parts by mass of, more preferably 2 to 70 parts by mass of, and further preferably 5 to 50 parts by mass of the unsaturated hydrocarbon group-containing compound is used with respect to 100 parts by mass of the phenol resin. If less than 1 part by mass of the unsaturated hydrocarbon group-containing compound is used, the flexibility of the cured film tends to decrease, and if more than 100 parts by mass of the unsaturated hydrocarbon group-containing compound is used, gelation is highly likely to occur during the reaction and the heat resistance of the cured film tends to decrease. In this reaction, p-toluenesulfonic acid, trifluoromethanesulfonic acid or the like may be used as a catalyst, as necessary. It is to be noted that a solvent such as toluene, xylene, methanol or tetrahydrofuran may be used in the reaction.

An acid-modified phenol resin, which is obtained by further reacting a polybasic acid anhydride with a phenolic hydroxyl group remaining in the phenol resin that has been modified by the unsaturated hydrocarbon group-containing compound generated by the above described method, may also be used as the ingredient (B). By acid-modifying with such a polybasic acid anhydride, a carboxy group is introduced, so that the solubility of the ingredient (B) in an alkaline aqueous solution (developing solution) can be further improved.

The type of the polybasic acid anhydride is not particularly limited, as long as it has an acid anhydride group formed by the dehydration and condensation of carboxy groups of polybasic acid having a plurality of such carboxy groups. Examples of the polybasic acid anhydride include: dibasic anhydrides such as phthalic anhydride, succinic anhydride, octenyl succinic anhydride, pentadodecenyl succinic anhydride, maleic anhydride, itaconic anhydride, tetrahydrophthalic anhydride, hexahydrophthalic anhydride, methyltetrahydrophthalic anhydride, methylhexahydrophthalic anhydride, nadic anhydride, 3,6-endomethylenetetrahydro phthalic anhydride, methylendomethylenetetrahydrophthalic anhydride, tetrabromophthalic anhydride and trimellitic anhydride; and aromatic tetrabasic dianhydrides such as biphenyltetracarboxylic dianhydride, naphthalenetetracarboxylic dianhydride, diphenyl ether tetracarboxylic dianhydride, butanetetracarboxylic dianhydride, cyclopentanetetracarboxylic dianhydride, pyromellitic anhydride and benzophenonetetracarboxylic dianhydride. These compounds may be used singly or in combination of two or more types. Among others, the polybasic acid anhydride is preferably a dibasic anhydride, and is more preferably one or more types selected from the group consisting of tetrahydrophthalic anhydride, succinic anhydride and hexahydrophthalic anhydride. This case is advantageous in that a resist pattern having a better shape can be formed.

The reaction of the phenolic hydroxyl group with the polybasic acid anhydride can be carried out at 50° C. to 130° C. In this reaction, preferably 0.10 to 0.80 moles of, more preferably 0.15 to 0.60 moles of, and further preferably 0.20 to 0.40 moles of the polybasic acid anhydride is reacted with 1 mole of the phenolic hydroxyl group. If the amount of the polybasic acid anhydride is less than 0.10 mole, the developing property tends to decrease, and if it exceeds 0.8 moles, the alkaline resistance of a light-unexposed portion tends to decrease.

From the viewpoint that the reaction is promptly carried out, a catalyst may be used in the above described reaction, as necessary. Catalysts used in the reaction include: tertiary amines such as triethylamine; quaternary ammonium salts such as triethylbenzylammonium chloride; imidazole compounds such as 2-ethyl-4-methylimidazole; and phosphorus compounds such as triphenylphosphine.

The acid value of the phenol resin that is further modified by the polybasic acid anhydride is preferably 30 to 200 mg KOH/g, more preferably 40 to 170 mg KOH/g, and further preferably 50 to 150 mg KOH/g. If the acid value is less than 30 mg KOH/g, a longer period of time tends to be required for alkaline development, when compared with a case in which the acid value is within the above-mentioned range, and on the other hand, if the acid value exceeds 200 mg KOH/g, the developing solution resistance of a light-unexposed portion tends to decrease, when compared with a case in which the acid value is within the above-mentioned range.

If taking into consideration the solubility of the ingredient (B) in an alkaline aqueous solution and the balance between photosensitive properties and the physical properties of a cured film, the weight average molecular weight of the ingredient (B) is preferably 1000 to 500000, more preferably 2000 to 200000, and further preferably 2000 to 100000. Herein, the weight average molecular weight means a value obtained by measuring the molecular weight by a gel permeation chromatography method and then converting the obtained value based on a standard polystyrene calibration curve.

From the viewpoint of sensitivity and resolution during the formation of a resist pattern, and the adhesion, mechanical properties and thermal shock resistance of a resist pattern after hardening, the mass ratio between the ingredient (A) and the ingredient (B) in the positive tone photosensitive composition is preferably from 5:95 to 95:5, more preferably from 10:90 to 90:10, and further preferably from 15:85 to 85:15, based on the total amount of the ingredients (A) and (B) that is defined as 100.

Ingredient (C)

The compound that generates an acid by the action of light, which is the ingredient (C), is used as a photosensitizing agent. The ingredient (C) has the function to generate an acid by light irradiation and to increase the solubility of a light-irradiated portion in an alkaline aqueous solution. As the ingredient (C), a compound generally referred to as a photoacid generator can be used. Specific examples of the ingredient (C) include an o-quinone diazide compound, aryl diazonium salts, diaryl iodonium salts and triaryl sulfonium salts. Of these, an o-quinone diazide compound is preferable because of its high sensitivity.

The o-quinone diazide compound is obtained, for example, by a method involving the condensation reaction of o-quinonediazide sulfonyl chloride with a hydroxy compound, an amino compound or the like in the presence of a dehydrochlorinating agent.

Examples of the o-quinonediazide sulfonyl chloride used in the reaction include benzoquinone-1,2-diazide-4-sulfonyl chloride, naphthoquinone-1,2-diazide-5-sulfonyl chloride, and naphthoquinone-1,2-diazide-4-sulfonyl chloride.

Examples of the hydroxy compound used in the reaction include hydroquinone, resorcinol, pyrogallol, bisphenol A, bis(4-hydroxyphenyl)methane, 2,2-bis(4-hydroxyphenyl) hexafluoropropane, 2,3,4-trihydroxybenzophenone, 2,3,4,4'-tetrahydroxybenzophenone, 2,2',4,4'-tetrahydroxybenzophenone, 2,3,4,2',3'-pentahydroxybenzophenone, 2,3,4,3',4',5'-hexahydroxybenzophenone, bis(2,3,4-trihydroxyphenyl)methane, bis(2,3,4-trihydroxyphenyl)propane, 4b,5,9b,10-tetrahydro-1,3,6,8-tetrahydroxy-5,10-dimethylindeno[2,1-a]indene, tris(4-hydroxyphenyl)methane, tris(4-hydroxyphenyl)ethane, and 1,1-bis(4-hydroxyphenyl)-1-[4-{1-(4-hydroxyphenyl)-1-methylethyl}phenyl]ethane.

Examples of the amino compound used in the reaction include p-phenylenediamine, m-phenylenediamine, 4,4'-diaminodiphenyl ether, 4,4'-diaminodiphenylmethane, 4,4'-diaminodiphenylsulfone, 4,4'-diaminodiphenylsulfide, o-aminophenol, m-aminophenol, p-aminophenol, 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, bis(3-amino-4-hydroxyphenyl)hexafluoropropane, and bis(4-amino-3-hydroxyphenyl)hexafluoropropane.

Examples of the dehydrochlorinating agent used in the reaction include sodium carbonate, sodium hydroxide, sodium bicarbonate, potassium carbonate, potassium hydroxide, trimethylamine, triethylamine, and pyridine. In addition, as a reaction solvent, dioxane, acetone, methyl ethyl ketone, tetrahydrofuran, diethyl ether, N-methyl pyrrolidone or the like is used.

An o-quinonediazide sulfonyl chloride and a hydroxy compound and/or an amino compound are preferably mixed so that the total molar number of the hydroxyl group and the amino group can be 0.5 to 1, with respect to 1 mole of the o-quinonediazide sulfonyl chloride. The preferred mixing ratio of a dehydrochlorinating agent and an o-quinonediazide sulfonyl chloride is within the range from 0.95/1 mole equivalent to 1/0.95 mole equivalent.

A preferred reaction temperature in the above described reaction is 0° C. to 40° C., and a preferred reaction time is 1 to 10 hours.

In terms of the difference between the dissolution rate of a light-exposed portion and the dissolution rate of a light-unexposed portion and the acceptable width of sensitivity, the amount of the ingredient (C) mixed is preferably 3 to 100 parts by mass, more preferably 5 to 50 parts by mass, and most preferably 5 to 30 parts by mass, with respect to the total amount of the ingredient (A) and the ingredient (B) that is 100 parts by mass.

Ingredient (D): A Thermal Cross-Linker

A thermal cross-linker reacts with the ingredient (A) and the ingredient (B), when a photosensitive resin film after the formation of a pattern is hardened by heating, so as to form a cross-linked structure. Thereby, the fragility of the film and the fusion of the film can be prevented. The thermal cross-linker is selected, for example, from a compound having a phenolic hydroxyl group, a compound having a hydroxymethylamino group, and a compound having an epoxy group.

The compound having a phenolic hydroxyl group used as a thermal cross-linker differs from the ingredient (A) and the ingredient (B). The compound having a phenolic hydroxyl group does not act only as a thermal cross-linker, but it can also increase the dissolution rate of a light-exposed portion during development in an alkaline aqueous solution, thereby improving sensitivity. The molecular weight of such a compound having a phenolic hydroxyl group is preferably 2000 or less. Taking into consideration solubility in an alkaline aqueous solution and the balance between photosensitive properties and the physical properties of a cured film, the number average molecular weight of the aforementioned compound is preferably 94 to 2000, more preferably 108 to 2000, and most preferably 108 to 1500.

Conventionally known compounds may be used as such compounds having a phenolic hydroxyl group, and a compound represented by the following formula (I) is particularly preferable because it is excellent in terms of the balance between the effect of promoting the dissolution of a light-exposed portion and the effect of preventing the fusion of a photosensitive resin film when it is hardened.

[Chemical Formula 1]

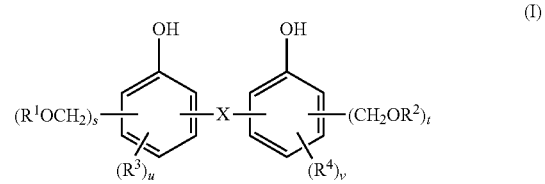

(I)

In the above formula (I), X represents a single bond or a divalent organic group; $R^1$, $R^2$, $R^3$ and $R^4$ independently represent a hydrogen atom or a monovalent organic group; s and t independently represent an integer of 1 to 3; and u and v independently represent an integer of 0 to 4.

The compound wherein, in the above formula (I), X is a single bond, is a biphenol (dihydroxybiphenyl) derivative. In addition, examples of the divalent organic group represented by X include: alkylene groups containing 1 to 10 carbon atoms, such as a methylene group, an ethylene group and a propylene group; alkylidene groups containing 2 to 10 carbon atoms, such as an ethylidene group; arylene groups containing 6 to 30 carbon atoms, such as a phenylene group; groups in which a part or all of the hydrogen atoms of these hydrocarbon groups are substituted with halogen atoms such as fluorine atoms; and a sulfonyl group, a carbonyl group, an ether bond, a thioether bond and an amide bond. Of these, X is preferably a divalent organic group represented by the following formula (II):

[Chemical Formula 2]

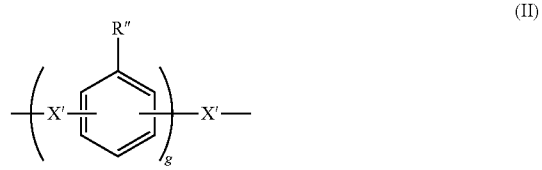

(II)

In the above formula (II), X' represents a single bond, an alkylene group (for example, an alkylene group containing 1 to 10 carbon atoms), an alkylidene group (for example, an alkylidene group containing 2 to 10 carbon atoms), a group in which a part or all of those hydrogen atoms are substituted with halogen atoms, a sulfonyl group, a carbonyl group, an ether bond, a thioether bond or an amide bond; R" represents a hydrogen atom, a hydroxyl group, an alkyl group or a haloalkyl group; g represents an integer of 1 to 10; a plurality of R"s may be identical to or different from one another.

Examples of the compound having a hydroxymethylamino group include nitrogen-containing compounds, in which all or a part of active methylol groups are alkyl-etherified, such as (poly)(N-hydroxymethyl)melamine, (poly)(N-hydroxymethyl)glycoluril, (poly)(N-hydroxymethyl)benzoguanamine, and (poly)(N-hydroxymethyl)urea. Herein, an alkyl group in alkyl ether is a methyl group, an ethyl group, a butyl group or a mixture thereof, and it may comprise an oligomer ingredient formed by self-condensation of a portion thereof. Specific examples include hexakis(methoxymethyl)melamine, hexakis(butoxymethyl)melamine, tetrakis (methoxymethyl) glycoluril, tetrakis(butoxymethyl)glycoluril, and tetrakis (methoxymethyl)urea.

Conventionally known compounds may be used as compounds having an epoxy group. Specific examples of such a compound include a bisphenol A epoxy resin, a bisphenol F epoxy resin, a phenol novolac epoxy resin, a cresol novolac epoxy resin, an aliphatic epoxy resin, glycidylamine, a heterocyclic epoxy resin, and polyalkylene glycol diglycidyl ether.

In addition to the above-mentioned compounds, the following compounds may be used as ingredients (D): aromatic compounds having a hydroxymethyl group, such as bis[3,4-bis(hydroxymethyl)phenyl]ether and 1,3,5-tris(1-hydroxy-1-methylethyl)benzene; compound having a maleimide group, such as bis(4-maleimidephenyl)methane and 2,2-bis[4-(4'-maleimidephenoxy)phenyl]propane; compounds having a norbornene skeleton; polyfunctional acrylate compounds; compound having an oxetanyl group; compounds having a vinyl group; and blocked isocyanate compounds.

Among the above described ingredients (D), compounds having a phenolic hydroxyl group and/or compounds having a hydroxymethylamino group are preferable from the viewpoint of the improvement of sensitivity and heat resistance.

In terms of developing time, the acceptable width of the film retention of a light-unexposed portion, and the properties of a cured film, the amount of the ingredient (D) mixed is preferably 1 to 50 parts by mass, more preferably 2 to 30 parts by mass, and most preferably 3 to 25 parts by mass, with respect to the total amount of the ingredient (A) and the ingredient (B) that is 100 parts by mass. In addition, the above described thermal cross-linkers are used singly or in combination of two or more types.

Ingredient (E)

The ingredient (E) is a solvent. By the fact that the positive tone photosensitive composition contains such a solvent, it exhibits the effects that the composition is easily applied to a support substrate and that a coating film with a uniform thickness can be formed thereon. Specific examples of the solvent include γ-butyrolactone, ethyl lactate, propylene glycol monomethyl ether acetate, benzyl acetate, n-butyl acetate, ethoxyethyl propionate, 3-methylmethoxy propionate, N-methyl-2-pyrrolidone, N,N-dimethylformamide, N,N-dimethylacetamide, dimethyl sulfoxide, hexamethylphosphorylamide, tetramethylenesulfone, diethyl ketone, diisobutyl ketone, methyl amyl ketone, cyclohexanone, propylene glycol monomethyl ether, propylene glycol monopropyl ether, propylene glycol monobutyl ether, and dipropylene glycol monomethyl ether.

These solvents may be used singly or in combination of two or more types. In addition, the amount of the ingredient (E) mixed is not particularly limited, and it is preferably adjusted, so that the ratio of the solvent in the positive tone photosensitive composition can be 20% to 90% by mass.

Ingredient (F)

In order to impart flexibility to a resist pattern after hardening, the positive tone photosensitive composition preferably may further comprise an elastomer as the ingredient (F). A conventionally known elastomer may be used herein, and the glass transition temperature (Tg) of a polymer constituting such an elastomer is preferably 20° C. or less.

Examples of such an elastomer include a styrene elastomer, an olefin elastomer, a urethane elastomer, a polyester elastomer, a polyamide elastomer, an acrylic elastomer and a silicone elastomer. These elastomers may be used singly or in combination of two or more types.

Examples of the styrene elastomer include a styrene-butadiene-styrene block copolymer, a styrene-isoprene-styrene block copolymer, a styrene-ethylene-butylene-styrene block copolymer, a styrene-ethylene-propylene-styrene block copolymer, and a styrene-butadiene-methacrylate block polymer. As an ingredient that constitutes the styrene elastomer, styrene derivatives such as α-methylstyrene, 3-methylstyrene, 4-propylstyrene and 4-cyclohexylstyrene may be used, as well as styrene.

Specific examples of a commercially available styrene elastomer include: Tufprene, Solprene T, Asaprene T and Tuftec (all of which are manufactured by Asahi Kasei Corporation); Elastomer AR (manufactured by Aronkasei Co., Ltd.); Krayton G and Califlex (both of which are manufactured by Shell Japan Ltd.); JSR-TR, TSR-SIS and Dainalon (all of which are manufactured by JSR Corporation); Denka STR (manufactured by Denki Kagaku Kogyo K.K.); Quintac (manufactured by Zeon Corporation); TPE-SB Series (manufactured by Sumitomo Chemical Co., Ltd.); Rubberon (manufactured by Mitsubishi Chemical Corporation); Septon and Hybrar (both of which are manufactured by Kuraray Co., Ltd.); Sumiflex (manufactured by Sumitomo Bakelite Co., Ltd.); Leostomer and Actimer (both of which are manufactured by Riken Vinyl Industry Co., Ltd.); and Paraloid EXL series (manufactured by Rohm and Haas Company).

Examples of the olefin elastomer include: α-olefin copolymers containing 2 to 20 carbon atoms (for example, an ethylene-propylene copolymer (EPR) and an ethylene-propylene-diene copolymer (EPDM)); copolymers of dienes containing 2 to 20 carbon atoms and α-olefins; carboxy-modified NBR in which methacrylic acid is copolymerized with an epoxidated polybutadiene butadiene-acrylonitrile copolymer; an ethylene-α-olefin copolymer rubber; an ethylene-α-olefin-diene copolymer rubber; a propylene-α-olefin copolymer rubber; and a butene-α-olefin copolymer rubber. Specific examples of the α-olefin containing 2 to 20 carbon atoms include ethylene, propylene, 1-butene, 1-hexene and 4-methyl-1-pentene, and specific examples of the dienes containing 2 to 20 carbon atoms include dicyclopentadiene, 1,4-hexadiene, cyclooctanediene, methylene norbornene, ethylidene norbornene, butadiene and isoprene.

Specific examples of a commercially available olefin elastomer include Milastomer (manufactured by Mitsui Petrochemical Industries, Ltd.), EXACT (manufactured by Exxon Mobile Corporation), ENGAGE (manufactured by Dow Chemical Company), Nipol series (manufactured by Zeon Corporation), DYNABON HSBR which is a hydrogenated styrene-butadiene rubber (manufactured by JSR Corporation), NBR series which are butadiene-acrylonitrile copolymers (manufactured by JSR Corporation), XER series which are biterminal carboxyl group-modified butadiene-acrylonitrile copolymers having a crosslinking point (manufactured by JSR Corporation), BF-1000 which is epoxidated polybutadiene in which polybutadiene is partially epoxidated (manufactured by Nippon Soda Co., Ltd.), and HYCAR series which are liquid butadiene-acrylonitrile copolymers (manufactured by Ube Industries, Ltd.).

A urethane elastomer consists of structural units consisting of a hard segment of a low molecular weight (short chain) diol and diisocyanate, and a soft segment of a high molecular weight (long chain) diol and diisocyanate. Examples of the high molecular weight (long chain) diol include polypropylene glycol, polytetramethylene oxide, poly(1,4-butylene adipate), poly(ethylene-1,4-butylene adipate), polycaprolactone, poly(1,6-hexylene carbonate) and poly(1,6-hexylene-neopentylene adipate). The number average molecular weight of the high molecular weight (long chain) diol is preferably 500 to 10000. Examples of the low molecular weight (short chain) diol include ethylene glycol, propylene glycol, 1,4-butanediol and bisphenol A. The number average molecular weight of the short chain diol is preferably 48 to 500.

Specific examples of a commercially available urethane elastomer include: PANDEX T-2185 and T-2983N (both of which are manufactured by Dainippon Ink & Chemicals); and Silactone E790 and Hitaloid series (manufactured by Hitachi Chemical Co., Ltd.).

A polyester elastomer is obtained by polycondensing dicarboxylic acid or a derivative thereof with a diol compound or a derivative thereof. Specific examples of the dicarboxylic acid include: aromatic dicarboxylic acids such as terephthalic acid, isophthalic acid and naphthalene dicarboxylic acid; aromatic dicarboxylic acids, wherein the hydrogen atoms of these aromatic rings are substituted with a methyl group, an ethyl group, a phenyl group or the like; aliphatic dicarboxylic acids containing 2 to 20 carbon atoms, such as adipic acid, sebacic acid and dodecane dicarboxylic acid; and alicyclic dicarboxylic acids such as cyclohexane dicarboxylic acid. These compounds may be used singly or in combination of two or more types. Specific examples of the diol compound include: aliphatic or alicyclic diols, such as ethylene glycol, 1,3-propane diol, 1,4-butane diol, 1,6-hexane diol, 1,10-decane diol and 1,4-cyclohexane diol; bisphenol A; bis-(4-hydroxyphenyl)-methane; bis-(4-hydroxy-3-methylphenyl)-propane; and resorcin. These compounds may be used singly or in combination of two or more types.

A multi-block copolymer comprising an aromatic polyester (for example, polybutylene terephthalate) portion as a hard segment component and an aliphatic polyester (for example, polytetramethylene glycol) portion as a soft segment component can be used as a polyester elastomer. There are various grades of such polyester elastomers, depending on differences between the hard segment and the soft segment, such as type, ratio and molecular weight.

Specific examples of a commercially available polyester elastomer include Hitrel (manufactured by DuPont-Toray Co., Ltd.), Pelprene (manufactured by Toyobo Co., Ltd.) and Espel (manufactured by Hitachi Chemical Co., Ltd.).

A polyamide elastomer is constituted with a hard segment consisting of polyamide and a soft segment consisting of polyether or polyester, and it is broadly divided into two types, namely, a polyether block amide type and a polyether ester block amide type. Examples of the polyamide include polyamide 6, polyamide 11 and polyamide 12, and examples of the polyether include polyoxyethylene, polyoxypropylene and polytetramethylene glycol.

Specific examples of a commercially available polyamide elastomer include UBE Polyamide Elastomer (manufactured by Ube Industries, Ltd.), Diamide (manufactured by Daicel Fuels), PEBAX (manufactured by Toray Industries, Inc.), Grilon ELY (manufactured by EMS Japan), Novamid (manufactured by Mitsubishi Chemical Corporation) and Grilux (manufactured by Dainippon Ink & Chemicals).

An acrylic elastomer is obtained by copolymerizing an acrylate such as ethyl acrylate, butyl acrylate, methoxyethyl acrylate or ethoxyethyl acrylate, with a monomer having an epoxy group, such as glycidyl methacrylate or allyl glycidyl ether, and/or a vinyl monomer such as acrylonitrile or ethylene.

Examples of the acrylic elastomer include an acrylonitrile-butyl acrylate copolymer, an acrylonitrile-butyl acrylate-ethyl acrylate copolymer, and an acrylonitrile-butyl acrylate-glycydyl methacrylate copolymer.

A silicone elastomer comprises organopolysiloxane as a main ingredient, and it is classified into polydimethylsiloxane, polymethylphenylsiloxane and polydiphenylsiloxane. An elastomer wherein a portion of the organopolysiloxane has been modified by a vinyl group, an alkoxy group or the like may also be used.

Specific examples of a commercially available silicone elastomer include KE series (manufactured by Shin-Etsu Chemical Co., Ltd.), SE series, CY series and SH series (all of which are manufactured by Dow Corning Toray Silicone Co., Ltd.).

In addition to the above described elastomers, a rubber-modified epoxy resin may also be used. Such a rubber-modified epoxy resin is obtained, for example, by modifying a part or all of the epoxy groups of a bisphenol F epoxy resin, a bisphenol A epoxy resin, a salicylaldehyde epoxy resin, a phenol novolac epoxy resin, a cresol novolac epoxy resin or the like, by a biterminal carboxylic acid-modified butadiene-acrylonitrile rubber, a terminal amino-modified silicone rubber or the like.

The ingredient (F) may be a particulate elastomer (hereinafter referred to as "elastomer particles" at times). The elastomer, particles means an elastomer dispersed in a positive tone photosensitive composition in the state of fine particles, and such elastomer particles include an elastomer serving as an island in a sea island structure formed by phase separation in an immiscible system, an elastomer serving as what is called a microdomain, and the like.

Elastomer particles (what are called cross-linked fine particles), in which a cross-linking monomer having two or more unsaturated polymerizable groups is copolymerized with one or more types of other monomers selected such that the Tg of the elastomer particles becomes 20° C. or less, are preferable. As other monomers, those copolymerized with a monomer having a functional group other than a polymerizable group, such as a carboxyl group, an epoxy group, an amino group, an isocyanate group or a hydroxyl group, are preferably used.

Examples of the cross-linking monomer include compounds having a plurality of polymerizable unsaturated groups, such as divinylbenzene, diallyl phthalate, ethylene glycol di(meth)acrylate, propylene glycol di(meth)acrylate, trimethylolpropane tri(meth)acrylate, pentaerythritol tri(meth)acrylate, polyethylene glycol di(meth)acrylate, and polypropylene glycol di(meth)acrylate. Of these, divinylbenzene is preferable.

The cross-linking monomer used in the production of elastomer particles is used in an amount of preferably 1% to 20% by mass, and more preferably 2% to 10% by mass, with respect to the total mass of all monomers used for copolymerization.

Examples of other monomers include: diene compounds such as butadiene, isoprene, dimethylbutadiene, chloroprene and 1,3-pentadiene; unsaturated nitrile compounds such as (meth)acrylonitrile, α-chloroacrylonitrile, α-chloromethylacrylonitrile, α-methoxyacrylonitrile, α-ethoxyacrylonitrile, crotonic acid nitrile, cinnamic acid nitrile, itaconic acid dinitrile, maleic acid dinitrile and fumaric acid dinitrile; unsaturated amides such as (meth)acrylamide, N,N'-methylenebis(meth)acrylamide, N,N'-ethylenebis(meth)acrylamide, N,N'-hexamethylenebis(meth)acrylamide, N-hydroxymethyl(meth)acrylamide, N-(2-hydroxyethyl)(meth)acrylamide, N,N-bis(2-hydroxyethyl)(meth)acrylamide, crotonic acid amide and cinnamic acid amide; (meth)acrylates such as methyl (meth)acrylate, ethyl (meth)acrylate, propyl (meth)acrylate, butyl (meth)acrylate, hexyl (meth)acrylate, lauryl (meth)acrylate, polyethylene glycol (meth)acrylate and polypropylene glycol (meth)acrylate; aromatic vinyl compounds such as styrene, α-methylstyrene, o-methoxystyrene, p-hydroxystyrene and p-isopropenylphenol; epoxy (meth)acrylates obtained by the reaction of the diglycidyl ether of bisphenol A, the diglycidyl ether of glycol or the like with (meth)acrylic acid, hydroxyalkyl (meth)acrylate or the like; urethane (meth)acrylates obtained by the reaction of hydroxyalkyl (meth)acrylate with polyisocyanate; epoxy group-containing unsaturated compounds such as glycidyl (meth)acrylate and (meth)allyl glycidyl ether; unsaturated acid compounds such as (meth)acrylic acid, itaconic acid, succinic acid-β-(meth)acryloxyethyl, maleic (meth)acryloxyethyl, phthalic acid-β-(meth)acryloxyethyl and hexahydrophthalic acid-β-(meth)acryloxyethyl; amino group-containing unsaturated compounds such as dimethylamino (meth)acrylate and diethylamino (meth)acrylate; amide group-containing unsaturated compounds such as (meth)acrylamide and dimethyl (meth)acrylamide; and hydroxyl group-containing unsaturated compounds such as hydroxyethyl (meth)acrylate, hydroxypropyl (meth)acrylate and hydroxybutyl (meth)acrylate.

Of these, butadiene, isoprene, (meth)acrylonitrile, (meth)acrylic acid alkyl esters, styrene, p-hydroxystyrene, p-isopropenylphenol, glycidyl (meth)acrylate, (meth)acrylic acid, hydroxyalkyl (meth)acrylates and the like are preferably used.

As such other monomers, at least one type of diene compound, and specifically, butadiene is preferably used. Such a diene compound is used in an amount of preferably 20% to 80% by mass, and more preferably 30% to 70% by mass, with respect to the total mass of all monomers used in copolymerization. By using a diene compound at the above described ratio, elastomer particles become rubber-like soft fine particles, and thus, the generation of cracks (splits) on the obtained cured film can be particularly prevented, so that a cured film excellent in terms of durability can be obtained.

The mean particle diameter of elastomer particles is preferably 30 to 500 nm, more preferably 40 to 200 nm, and further preferably 50 to 120 nm. A method for controlling the particle diameter of elastomer particles is not particularly limited, and for example, when such elastomer particles are synthesized by emulsion polymerization, the number of micelles is controlled based on the amount of an emulsifier used during the emulsion polymerization, so as to control the particle diameter.

The ingredient (F) is mixed in an amount of preferably 1 to 50 parts by mass, and more preferably 5 to 30 parts by mass, with respect to the total amount of the ingredient (A) and the ingredient (B) that is 100 parts by mass. If the mixed amount of the elastomer is less than 1 part by mass, the thermal shock resistance of the obtained cured film tends to decrease, and in contrast, if it exceeds 50 parts by mass, resolution and the heat resistance of the obtained cured film tend to decrease, or the compatibility with other ingredients and dispersibility tend to decrease.

Other Ingredients

The above described positive tone photosensitive composition may further comprise ingredients such as a compound that generates an acid by heating, a dissolution promoter, a dissolution inhibitor, a coupling agent, a surfactant or a leveling agent, in addition to the above described ingredients (A) to (F).

(Compound that Generates Acid by Heating)

By using a compound that generates an acid by heating, it becomes possible to generate an acid, when the photosensitive resin film obtained after development is heated, and the reaction of the ingredient (A) and the ingredient (B) with the ingredient (D), namely, a thermal cross-linking reaction can be promoted, and the heat resistance of the obtained cured film can be thereby improved. In addition, since such a compound generating an acid by heating generates an acid even by light irradiation, the solubility of a light-exposed portion in an alkaline aqueous solution is increased. Accordingly, the difference between the solubility of a light-unexposed portion in an alkaline aqueous solution and the solubility of a light-exposed portion therein is further increased, so that resolution can be improved.

Such a compound that generates an acid by heating preferably generates an acid by being heated up to, for example, 50° C. to 250° C. Specific examples of such a compound that generates an acid by heating include: a salt formed from a strong acid and a base, such as an onium salt; and imidosulfonate.

Examples of such onium salts include: diaryliodonium salts such as an aryldiazonium salt and a diphenyliodonium salt; di(alkylaryl)iodonium salts such as a di(t-butylphenyl)iodonium salt; trialkylsulfonium salts such as a trimethylsulfonium salt; dialkylmonoarylsulfonium salts such as a dimethylphenylsulfonium salt; diarylmonoalkyliodonium salts such as a diphenylmethylsulfonium salt; and triarylsulfonium salts. Of these, the di(t-butylphenyl)iodonium salt of paratluenesulfonic acid, the di(t-butylphenyl)iodonium salt of trifluoromethanesulfonic acid, the trimethylsulfonium salt of trifluoromethanesulfonic acid, the dimethylphenylsulfonium salt of trifluoromethanesulfonic acid, the diphenylmethylsulfonium salt of trifluoromethanesulfonic acid, the di(t-butylphenyl)iodonium salt of nonafluorobutanesulfonic acid, the diphenyliodonium salt of camphorsulfonic acid, the diphenyliodonium salt of ethanesulfonic acid, the dimethylphenylsulfonium salt of benzenesulfonic acid, and the diphenylmethylsulfonium salt of toluenesulfonic acid are preferable.

Moreover, in addition to the above described onium salts, the following salts, which are formed from strong acids and bases, such as pyridinium salts, may be used. Examples of the strong acid include: aryl sulfonic acids such as p-toluenesulfonic acid and benzenesulfonic acid; perfluoroalkyl sulfonic acids such as camphorsulfonic acid, trifluoromethanesulfonic acid and nonafluorobutanesulfonic acid; and alkyl sulfonic acids such as methanesulfonic acid, ethanesulfonic acid and butanesulfonic acid. Examples of the base include: alkylpyridines such as pyridine and 2,4,6-trimethylpyridine; N-alkylpyridines such as 2-chloro-N-methylpyridine; and halogenated N-alkyl pyridine.

As imidosulfonate, naphtoyl imidosulfonate or phthalimidosulfonate may be used, for example.

As a compound that generates an acid by heating, in addition to the above described compounds, a compound having a structure represented by formula (III) as shown below, or a compound having a sulfonamide structure represented by formula (IV) as shown below may also be used.

$$R^5R^6C=N-O-SO_2-R^7 \quad (III)$$

$$-NH-SO_2-R^8 \quad (IV)$$

In the above formula (III), $R^5$ represents, for example, a cyano group, and $R^6$ represents, for example, a methoxyphenyl group or a phenyl group. In addition, $R^7$ represents, for example, an aryl group such as a p-methylphenyl group or a phenyl group, an alkyl group such as a methyl group, an ethyl group or an isopropyl group, or a perfluoroalkyl group such as a trifluoromethyl group or a nonafluorobutyl group.

In the above formula (IV), $R^8$ represents, for example, an alkyl group such as a methyl group, an ethyl group or a propyl group, an aryl group such as a methylphenyl group or a phenyl group, or a perfluoroalkyl group such as a trifluoromethyl group or a nonafluorobutyl group. Examples of a group that binds to the N atom in the sulfonamide structure represented by the formula (IV) include 2,2'-bis(4-hydroxyphenyl) hexafluoropropane, 2,2'-bis(4-hydroxyphenyl)propane, and di(4-hydroxyphenyl)ether.

The compound that generates an acid by heating is mixed in an amount of preferably 0.1 to 30 parts by mass, more preferably 0.2 to 20 parts by mass, and further preferably 0.5 to 10 parts by mass, with respect to the total amount of the ingredient (A) and the ingredient (B) that is 100 parts by mass.

(Dissolution Promoter)

By mixing a dissolution promoter into the above described positive tone photosensitive composition, the dissolution rate of a light-exposed portion is increased, when it is developed in an alkaline aqueous solution, so that sensitivity and resolution can be improved. As such dissolution promoters, conventionally known dissolution promoters can be used. Specific examples of the dissolution promoter include compounds having a carboxyl group, sulfonic acid, and a sulfonamide group.

When such a dissolution promoter is mixed, the amount of the dissolution promoter mixed can be determined depending on the dissolution rate in an alkaline aqueous solution, and for example, the dissolution promoter can be mixed in an amount of 0.01 to 30 parts by mass with respect to the total amount of the ingredient (A) and the ingredient (B) that is 100 parts by mass.

(Dissolution Inhibitor)

The dissolution inhibitor is a compound that inhibits the dissolution of the ingredient (A) and the ingredient (B) in an alkaline aqueous solution, and it is used to control the thickness of a remaining film, a developing time, and a contrast. Specific examples of the dissolution inhibitor include diphenyliodonium nitrate, bis(p-tert-butylphenyl)iodonium nitrate, diphenyliodonium bromide, diphenyliodonium chloride, and diphenyliodonium iodide. When such a dissolution inhibitor is mixed, from the viewpoint of the acceptable widths of sensitivity and a developing time, the dissolution inhibitor is mixed in an amount of preferably 0.01 to 20 parts by mass, more preferably 0.01 to 15 parts by mass, and further preferably 0.05 to 10 parts by mass, with respect to the total amount of the ingredient (A) and the ingredient (B) that is 100 parts by mass.

(Coupling Agent)

By mixing a coupling agent into the above described positive tone photosensitive composition, the adhesion between the formed cured film and the substrate can be enhanced. Examples of the coupling agent include an organic silane compound and an aluminum chelating compound.

Examples of the organic silane compound include vinyltriethoxysilane, γ-glycidoxypropyltriethoxysilane, γ-methacryloxypropyltrimethoxysilane, urea propyltriethoxysilane, methylphenylsilanediol, ethylphenylsilanediol, n-propylphenylsilanediol, isopropylphenylsilanediol, n-butylphenylsilanediol, isobutylphenylsilanediol, tert-butylphenylsilanediol, diphenylsilanediol, ethylmethylphenylsilanol, n-propylmethylphenylsilanol, isopropylmethylphenylsilanol, n-butylmethylphenylsilanol, isobutylmethylphenylsilanol, tert-butylmethylphenylsilanol, ethyl-n-propylphenylsilanol, ethylisopropylphenylsilanol, n-butylethylphenylsilanol, isobutylethylphenylsilanol, tert-butylethylphenylsilanol, methyldiphenylsilanol, ethyldiphenylsilanol, n-propyldiphenylsilanol, isopropyldiphenylsilanol, n-butyldiphenylsilanol, isobutyldiphenylsilanol, tert-butyldiphenylsilanol, phenylsilanetriol, 1,4-bis(trihydroxysilyl)benzene, 1,4-bis(methyldihydroxysilyl)benzene, 1,4-bis(ethyldihydroxysilyl)benzene, 1,4-bis(propyldihydroxysilyl)benzene, 1,4-bis(butyldihydroxysilyl)benzene, 1,4-bis(dimethylhydroxysilyl)benzene, 1,4-bis(diethylhydroxysilyl)benzene, 1,4-bis(dipropylhydroxysilyl)benzene, and 1,4-bis(dibutylhydroxysilyl)benzene.

When a coupling agent is used, it is mixed in an amount of preferably 0.1 to 20 parts by mass, and more preferably 0.5 to 10 parts by mass, with respect to the total amount of the ingredient (A) and the ingredient (B) that is 100 parts by mass.

(Surfactant or Leveling Agent)

By mixing a surfactant or a leveling agent into the above described positive tone photosensitive composition, coating properties, for example, striation (unevenness in film thickness) can be prevented, or developing properties can be improved. Examples of such a surfactant or a leveling agent include polyoxyethylene uraryl ether, polyoxyethylene stearyl ether, polyoxyethylene oleyl ether, and polyoxyethylene octyl phenol ether. Commercially available surfactants or leveling agents include Megaface F171, F173 and R-08 (all of which are the trade names of products manufactured by Dainippon Ink & Chemicals), Fluorad FC430 and FC431 (both of which are the trade names of products manufactured by Sumitomo 3M Limited), and Organosiloxane Polymers KP341, KBM303, KBM403 and KBM803 (all of which are the trade names of products manufactured by Shin-Etsu Chemical Co., Ltd.).

When a surfactant or leveling agent is used, the total mixed amount of the two agents is preferably 0.001 to 5 parts by mass, and more preferably 0.01 to 3 parts by mass, with respect to the total amount of the ingredient (A) and the ingredient (B) that is 100 parts by mass.

The positive tone photosensitive composition can be developed in an alkaline aqueous solution such as tetramethylammonium hydroxide (TMAH). Moreover, by using the above described positive tone photosensitive composition, a resist pattern having high adhesion and thermal shock resistance can be formed with sufficiently high sensitivity and resolution.

Method for Producing Resist Pattern

The method for producing a resist pattern according to the present embodiment comprises: a step of applying a positive tone photosensitive composition onto a supporting substrate and then drying the applied positive tone photosensitive composition to form a photosensitive resin film (film formation step); exposing the photosensitive resin film to light (light exposure step); a step of developing the photosensitive resin film obtained after completion of the light exposure in an alkaline aqueous solution to form a resist pattern (development step); and heating the resist pattern (heating step).

Film Formation Step

In the film formation step, the above described positive tone photosensitive composition is applied onto a supporting substrate such as a glass substrate, a semiconductor, a metal oxide insulator (for example, $TiO_2$, $SiO_2$, etc.) or a silicon nitride, according to spin coating using a spinner or the like. The thus applied positive tone photosensitive composition is dried by heating with a hot plate, an oven or the like. Thereby, a film of positive tone photosensitive composition (a photosensitive resin film) is formed on the supporting substrate.

Light Exposure Step

In the light exposure step, active light beam such as ultraviolet light, visible light or radioactive ray is applied via a mask to the photosensitive resin film formed on the supporting substrate. Since the ingredient (A) is highly transparent to i-line, irradiation with such i-line can be preferably used. After completion of the light exposure, post exposure bake (PEB) can be carried out, as necessary. The temperature applied to such post exposure bake is preferably 70° C. to 140° C., and the time for such post exposure bake is preferably 1 to 5 minutes.

Development Step

In the development step, the light-exposed portion of the photosensitive resin film after the light exposure step is removed with a developing solution, so as to pattern the photosensitive resin film. Examples of the developing solution preferably used herein include alkaline aqueous solutions such as sodium hydroxide, potassium hydroxide, sodium silicate, ammonia, ethylamine, diethylamine, triethylamine, triethanolamine and tetramethylammonium hydroxide (TMAH). The base concentration is preferably set at 0.1% to 10% by mass in these aqueous solutions. Further, an alcohol or a surfactant may be added to the above described developing solution, and the thus prepared developing solution may be used. Such an alcohol or a surfactant may be mixed within the range of preferably 0.01 to 10 parts by mass, and more preferably 0.1 to 5 parts by mass, with respect to 100 parts by mass of a developing solution.

Heating Step

In the heating step, the photosensitive resin composition is hardened by heating the patterned photosensitive resin film (a resist pattern). From the viewpoint that damage caused by heat to an electronic device is sufficiently prevented, the heating temperature is desirably 250° C. or less, more desirably 225° C. or less, and further desirably 140° C. to 200° C.

The heat treatment can be carried out using an oven such as a quartz tube furnace, a hot plate, a rapid thermal anneal, a vertical diffusion furnace, an infrared curing oven, an electron beam curing oven and a microwave curing oven. Moreover, the heat treatment can be carried out either in an atmospheric air or in an inert atmosphere such as in a nitrogen atmosphere, and the heat treatment is desirably carried out in a nitrogen atmosphere because the oxidation of the pattern can be prevented therein. Since the above described desired heating temperature range is lower than the conventional heating temperature, damage to the supporting substrate or the electronic device can be reduced to a small extent. Accordingly, by applying the method for producing a resist pattern of the present embodiment, electronic devices can be produced at high yields. Moreover, the use of the production method of the present embodiment would lead to saving of energy in the process. Furthermore, according to the positive tone photosensitive composition of the present embodiment, since volume shrinkage (cure shrinkage) found in photosensitive polyimide and the like in the heat treatment step is small, a decrease in size precision can be prevented.

The heating time applied in the heating step is not particularly limited, as long as it is a time sufficient for the hardening of the positive tone photosensitive composition, and in general, it is preferably 5 hours or less, from the viewpoint of balance with work efficiency.

Further, the heating operation may also be carried out using a microwave curing device or a frequency-changeable microwave curing device, as well as the above described oven. By using these devices, it is possible to effectively heat only the photosensitive resin film, while keeping the temperature of a substrate or an electronic device at 200° C. or less, for example.

Since a microwave is applied in a pulsed state, while changing its frequency, in the case of a frequency-changeable microwave curing device, this device is preferable in that a standing wave can be prevented and the surface of a substrate can be uniformly heated. In addition, in a case in which a substrate comprises a metal wiring as with the after-mentioned electronic component, if a microwave is applied in a pulsed state while changing its frequency, it is preferable because the discharge from a metal or the like can be prevented and the electronic component can be prevented from being destroyed. Moreover, if the heating operation is carried out using a frequency-changeable microwave, it is preferable because the physical properties of a cured film do not decrease even if the hardening temperature is decreased, when compared with the case of using an oven (see J. Photopolym. Sci. Technol., 18, 327-332 (2005)).

The frequency of a frequency-changeable microwave is within the range between 0.5 and 20 GHz. For practical purposes, it is preferably within the range between 1 and 10 GHz, and more preferably within the range between 2 and 9 GHz. Moreover, the frequency of a microwave to be applied is desirably continuously changed, and a microwave is practically applied while changing its frequency stepwise. During that operation, a standing wave, discharge from a metal and the like are hardly generated, if the time required for irradiation with a microwave having a single frequency is as short as possible, and thus, the irradiation time is preferably 1 millisecond or less, and more preferably 100 microsecond or less.

The output of a microwave to be applied is different depending on the size of a device and the amount of a product to be heated, and it is generally within the range between 10 and 2000 W, and for practical purposes, it is more preferably between 100 and 1000 W, further preferably between 100 and 700 W, and most preferably between 100 and 500 W. If the output is 10 W or less, it is difficult to heat a product to be heated in a short time, and if it is 2000 W or more, it is not preferable because a drastic temperature increase may easily occur.

A microwave is preferably applied in a series of different pulsed on/off cycles. By applying a microwave in such a pulsed state, the predetermined heating temperature can be maintained, and further, damage to a cured film or a substrate can be preferably avoided. The time required for applying such a pulsed microwave once is different depending on conditions, and in general, it is preferably 10 seconds or less.

According to the above described method for producing a resist pattern, a resist pattern having high heat resistance can be obtained with sufficiently high sensitivity and resolution.

Electronic Component

As an application example of the method for producing a resist pattern, an embodiment of a process of producing a semiconductor device as an electronic component will be described based on drawings. FIGS. 1-5 are schematic sectional views each illustrating one embodiment of the production process of a semiconductor device having a multilayer wiring structure.

In the production method of the present embodiment, first, a structure 100 as shown in FIG. 1 is prepared. The structure 100 comprises: a semiconductor substrate 1 having a circuit element, such as an Si substrate; a protective film 2, which has a predetermined pattern in which the circuit element is exposed and which covers the semiconductor substrate 1, such as a silicon dioxide film; a first conductor layer 3 formed on the exposed circuit element; and an interlayer dielectric film 4 consisting of a polyimide resin or the like, which is formed on the protective film 2 and the first conductor layer 3 according to a spin coating method or the like.

Figure 2:
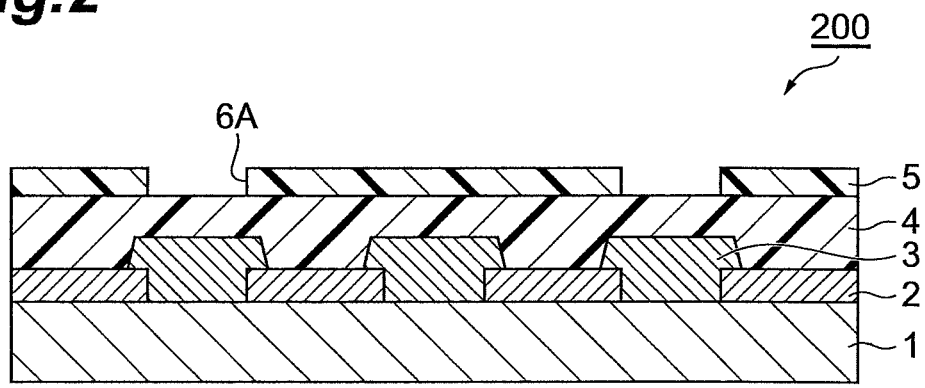
FIG. 2 is a schematic sectional view illustrating one embodiment of the production process of a semiconductor device.

Next, a photosensitive resin layer 5 having a window portion 6A is formed on the interlayer dielectric film 4, so as to form a structure 200 as shown in FIG. 2. The photosensitive resin layer 5 is formed by applying, for example, a chlorinated rubber, phenol novolac, polyhydroxystyrene or polyacrylate photosensitive resin according to the spin coating method. The window portion 6A is formed by a known photo-etching technique, such that the interlayer dielectric film 4 in a predetermined portion is exposed.

Figure 3:
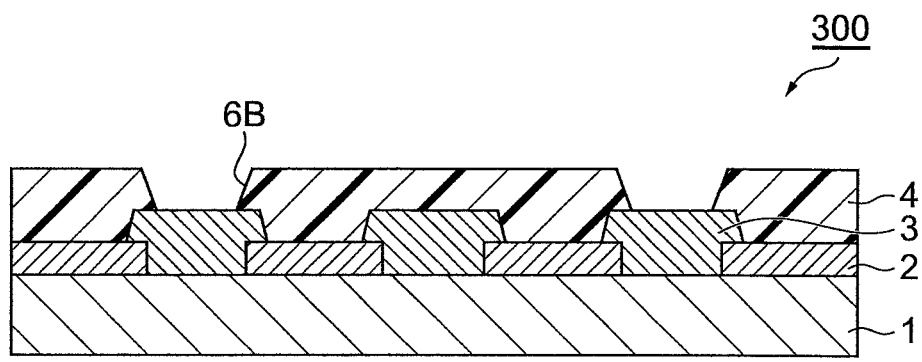
FIG. 3 is a schematic sectional view illustrating one embodiment of the production process of a semiconductor device.

After the interlayer dielectric film 4 has been etched to form a window portion 6B, the photosensitive resin layer 5 is eliminated, so that a structure 300 as shown in FIG. 3 can be obtained. For the etching of the interlayer dielectric film 4, a dry etching means using gas such as oxygen or carbon tetrafluoride can be applied. By this etching, the interlayer dielectric film 4 corresponding to the window portion 6A is selectively eliminated, and as a result, there can be obtained an interlayer dielectric film 4, in which the window portion 6B is established such that the first conductor layer 3 is exposed. Subsequently, the photosensitive resin layer 5 is eliminated using an etching solution, which corrodes only the photosensitive resin layer 5 without corroding the first conductor layer 3 exposed from the window portion 6B.

Figure 4:
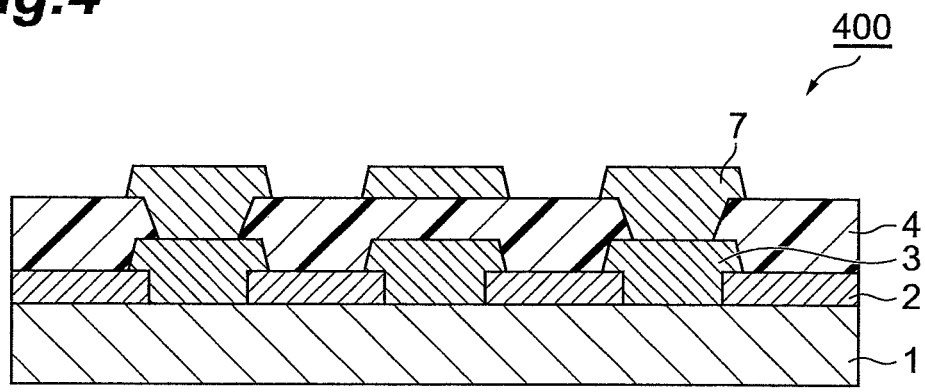
FIG. 4 is a schematic sectional view illustrating one embodiment of the production process of a semiconductor device.

Further, a second conductor layer 7 is formed in a portion corresponding to the window portion 6B, so as to obtain a structure 400 as shown in FIG. 4. A known photo-etching technique can be applied to the formation of the second conductor layer 7. Thereby, the second conductor layer 7 is electrically connected with the first conductor layer 3.

Figure 5:
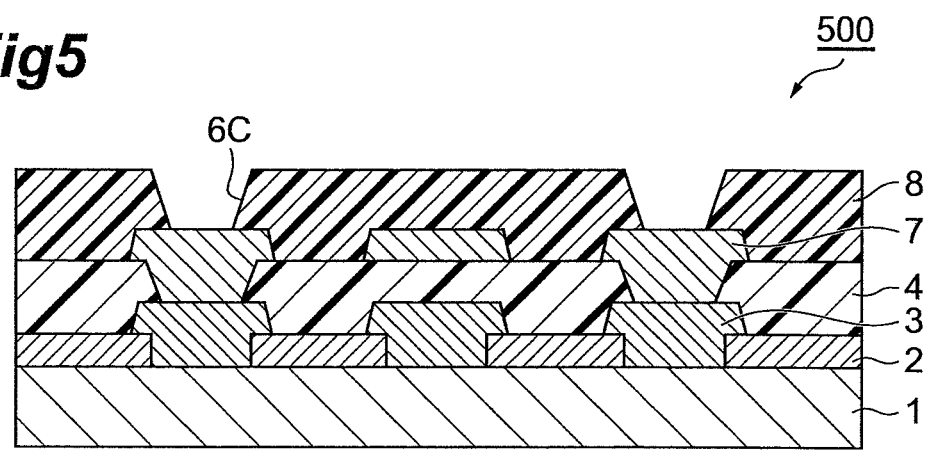
FIG. 5 is a schematic sectional view illustrating one embodiment of the production process of a semiconductor device.

Finally, a surface-protective layer 8 is formed on the interlayer dielectric film 4 and the second conductor layer 7, so as to obtain a semiconductor device 500 as shown in FIG. 5. In the present embodiment, the surface-protective layer 8 is formed as follows. First, the positive tone photosensitive composition according to the above described embodiment is applied onto the interlayer dielectric film 4 and the second conductor layer 7 according to a spin coating method, and it is then dried to form a photosensitive resin film. Subsequently, light is applied to a predetermined portion via a mask on which a pattern corresponding to the window portion 6C is depicted, and the photosensitive resin film is then developed in an alkaline aqueous solution, so as to pattern it. Thereafter, the photosensitive resin film is hardened by heating, so as to form a film serving as a surface-protective layer 8. This surface-protective layer 8 is used to protect the first conductor layer 3 and the second conductor layer 7 from external stress, α-ray, etc., and the obtained semiconductor device 500 is highly reliable.

In the above described embodiment, a method for producing a semiconductor device having a bilayer wiring structure has been described, but in the case of forming a multilayer wiring structure consisting of three or more layers, individual layers can be formed by repeatedly carrying out the above described steps. That is to say, a multilayer pattern can be formed by repeating the steps of forming the interlayer dielectric film 4 and the steps of forming the surface-protective layer 8. Moreover, in the above described example, not only the surface-protective layer 8, but also the interlayer dielectric film 4 can be formed using the positive tone photosensitive composition according to the present embodiment.

The electronic component according to the present embodiment has a resist pattern formed by the above described production method. The electronic component comprises a semiconductor device, a multilayer wiring board and various types of electronic devices. Specifically, the electronic component according to the present embodiment has the resist pattern as at least one type of structural material selected from the group consisting of an interlayer dielectric layer, a surface-protective film, a cover coating layer, a core used for a redistribution layer, a collar for holding a conductive ball that is an external connection terminal, and an underfill. Other structures of the electronic component are not particularly limited.

Figure 6:
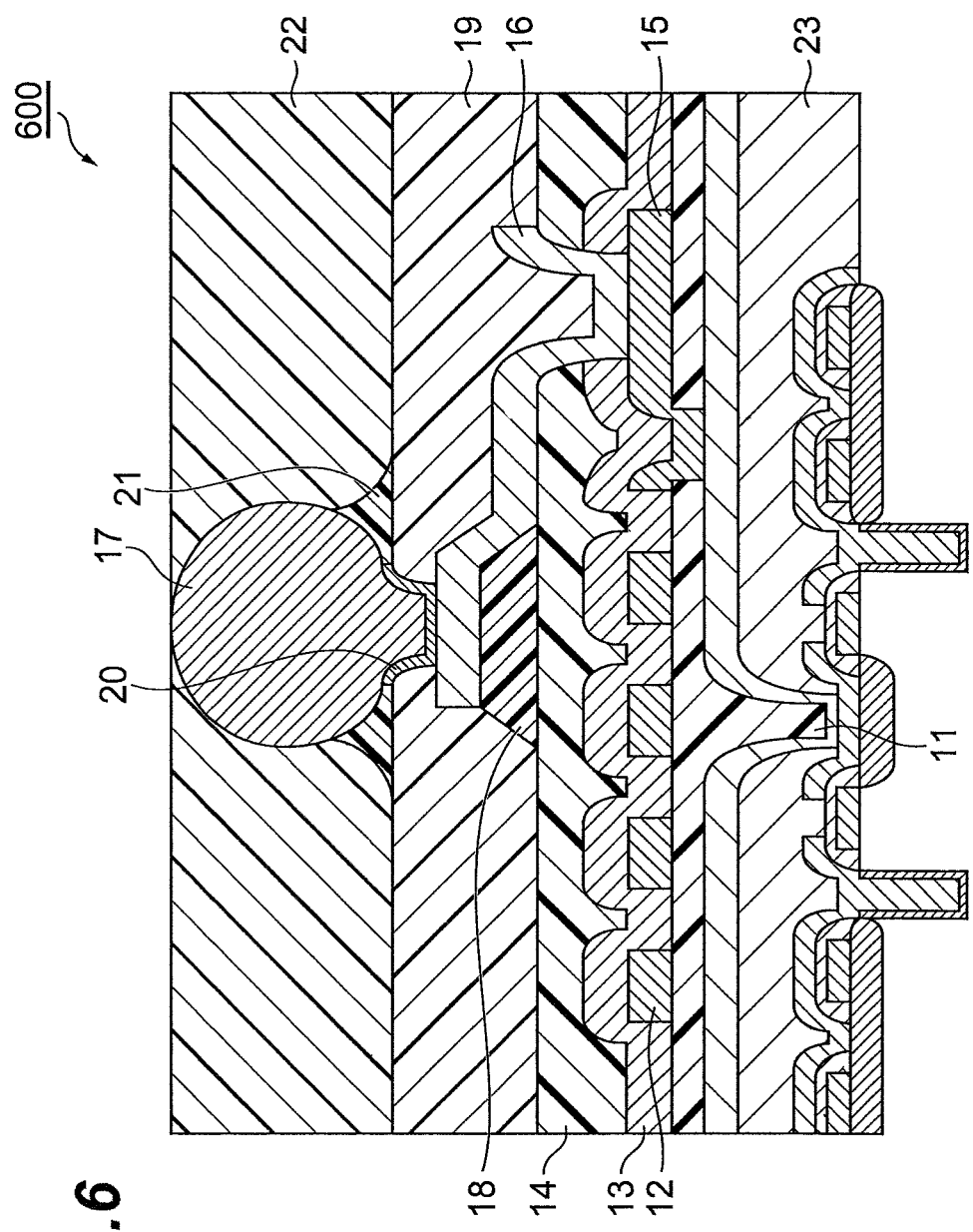
FIG. 6 is a schematic sectional view illustrating one embodiment of an electronic component (semiconductor device).
Figure 7:
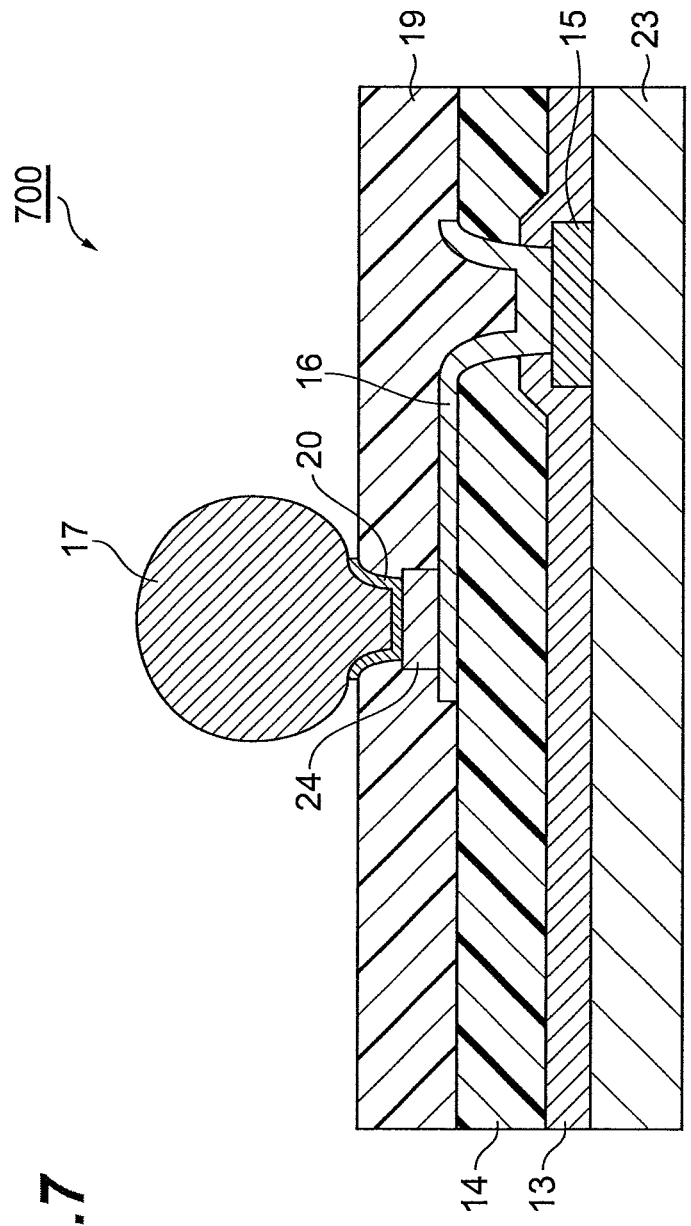
FIG. 7 is a schematic sectional view illustrating one embodiment of an electronic component (semiconductor device).

FIG. 6 and FIG. 7 are schematic sectional views each illustrating one embodiment of a semiconductor device. A semiconductor 600 as shown in FIG. 6 comprises: a silicon chip 23; an interlayer dielectric film 11 established on one surface side of the silicon chip 23; an Al wiring layer 12 having a pattern containing a pad portion 15, which is formed on the interlayer dielectric film 11; an insulation layer 13 (for example, a P—SiN layer) and a surface-protective layer 14, which are successively laminated on the interlayer dielectric film 11 and the Al wiring layer 12, while they have an aperture on the pad portion 15; an island-shaped core 18 disposed in the neighborhood of the aperture on the surface-protective layer 14; and a redistribution layer 16, which comes into contact with the pad portion 15 in the aperture of the insulation layer 13 and the surface-protective layer 14, and which extends on the surface-protective layer 14, such that it comes into contact with a surface of the core 18 used for the redistribution layer, which is on the side opposite to the surface-protective layer 14. Moreover, the semiconductor device 600 comprises: a cover coating layer 19, which is formed such that it covers the surface-protective layer 14, the core 18 and the redistribution layer 16, and which has an aperture in the redistribution layer 16 on the core 18; a conductive ball 17, which is connected with the redistribution layer 16, while sandwiching a barrier metal 20 between them, at the aperture of the cover coating layer 19; a collar 21, which holds the conductive ball; and an underfill 22 established on the cover coating layer 19 around the conductive ball 17. The conductive ball 17 is used as an external connection terminal, and it is formed from solder, gold or the like. The underfill 22 is established to alleviate stress, when the semiconductor device 600 is implemented.

In a semiconductor device 700 as shown in FIG. 7, the Al wiring layer (not shown in the figure) and the pad portion 15 of the Al wiring layer are formed on the silicon chip 23, and in the upper portion thereof, the insulation layer 13 is formed, and the surface-protective layer 14 of the device is further formed. On the pad portion 15, the redistribution layer 16 is formed, and this redistribution layer 16 extends to the upper portion of a connection 24 with the conductive ball 17. Further, on the surface-protective layer 14, the cover coating layer 19 is formed. The redistribution layer 16 is connected with the conductive ball 17 via the barrier metal 20.

In the semiconductor devices of FIGS. 6 and 7, the structural material selected from among the interlayer dielectric layer 11, the surface-protective layer 14, the cover coating layer 19, the core 18, the collar 21 and the underfill 22 is a resist pattern formed from the positive tone photosensitive composition according to the present embodiment. The resist pattern as a cured film, which is formed from the positive tone photosensitive composition according to the present embodiment, is excellent in terms of adhesion to metallic layers, such as the Al wiring layer 12 and the redistribution layer 16, a sealing agent and other components, and it also has a high effect of alleviating stress. Accordingly, a semiconductor device, in which this cured film is used as the cover coating layer 19, the core 18 used for rewiring, the collar 21 used for a ball such as solder, or the underfill 12 used in a flip chip, is extremely highly reliable.

By using the positive tone photosensitive composition according to the present embodiment, in the above described heating step, which has conventionally required a temperature of 300° C. or more, hardening can be carried out at a low temperature of 200° C. or less. Moreover, since the positive tone photosensitive composition according to the present embodiment has a small extent of volume shrinkage (cure shrinkage) in the heating step, which has been observed in photosensitive polyimide or the like, a decrease in size precision can be prevented. A cured film formed from the positive tone photosensitive composition has a high glass transition temperature. Accordingly, it becomes a surface-protective film excellent in terms of heat resistance. As a result, highly reliable electronic components such as semiconductor devices can be obtained at good yield ratios, at high yields.

EXAMPLES

Hereinafter, the present invention will be more specifically described in the following examples. However, the present invention is not limited by these examples.

Preparation of Ingredient (A)

Synthetic Example 1

Synthesis of Alkali-Soluble Resin (A3) Having Phenolic Hydroxyl Group 15.48 g of 4,4'-diphenyl ether dicarboxylic acid and 90 g of N-methylpyrrolidone were added to a 0.5-L flask equipped with a stirrer and a thermometer. The obtained mixture was cooled to 5° C., and 12.64 g of thionyl chloride was then added dropwise thereto, so that they were reacted for 30 minutes to obtain a solution of 4,4'-diphenyl ether tetracarboxylic acid chloride. Subsequently, 87.50 g of N-methyl pyrrolidone was added to a 0.5-L flask equipped with a stirrer and a thermometer, and 18.30 g of 2,2-bis(3-amino-4-hydroxyphenyl)-1,1,1,3,3,3-hexafluoropropane was then added thereto. While stirring the solution, the added compounds were dissolved therein, and thereafter, 8.53 g of pyridine was added to the reaction solution. While keeping the temperature at 0° C. to 5° C., the above described 4,4'-diphenyl ether dicarboxylic acid chloride solution was added dropwise to the solution over 30 minutes, and a stirring operation was then continued for 30 minutes. Thereafter, the reaction solution was poured into 3 L of water, and a precipitate was then recovered. The precipitate was washed with pure water three times, and it was then dried under a reduced pressure, so as to obtain polyhydroxyamide (a polybenzoxazole precursor) (hereinafter referred to as "A3"). The weight average molecular weight of this A3, which was calculated relative to standard polystyrene according to a GPC method, was 14600, and the dispersity thereof was 1.6.

Synthetic Example 2

Synthesis of Alkali-Soluble Resin (A4) Having No Phenolic Hydroxyl Groups 4.00 g of 4,4'-diaminodiphenyl ether was placed in a 0.5-L flask equipped with a stirrer and a thermometer, and it was dissolved in 16.68 g of sufficiently dehydrated N,N-dimethylacetamide, and thereafter, 8.88 g of 2,2-bis(3,4-dicarboxyphenyl)-1,1,1,3,3,3-hexafluoropropane dianhydride was gradually added to the solution. Thereafter, the mixed solution was stirred at a room temperature (25° C.) for 24 hours, so as to obtain a solution of polyamic acid (a polyimide precursor) (hereinafter referred to as "A4").

Preparation of Ingredient (B)

Synthetic Example 3

Synthesis of Vegetable Oil-Modified Phenol Resin (B1)

100 g of a cresol novolac resin (m-cresol/p-cresol (molar ratio)=60/40; weight average molecular weight: 7000; manufactured by Asahi Organic Chemicals Industry Co., Ltd.; trade name "EP4050G"), 15 g of paulownia oil and 0.01 g of p-toluenesulfonic acid were mixed, and the obtained mixture was then stirred at 120° C. for 2 hours. The reaction solution was cooled to a room temperature, and a vegetable oil-modified phenol resin (B1) was obtained as a reaction product.

Synthesis Example 4

Synthesis of Vegetable Oil-Modified Phenol Resin (B2)

100 parts by mass of phenol, 11 parts by mass of linseed oil and 0.1 part by mass of trifluoromethanesulfonic acid were mixed, and the obtained mixture was then stirred at 120° C. for 2 hours to obtain a vegetable oil-modified phenol derivative (a). Subsequently, 101 g of the vegetable oil-modified phenol derivative (a), 16.3 g of paraformaldehyde and 1.0 g of oxalic acid were mixed, and the obtained mixture was then stirred at 90° C. for 3 hours. Thereafter, the temperature of the reaction solution was increased to 120° C., the solution was then stirred under a reduced pressure for 3 hours, the reaction solution was then cooled to a room temperature under an atmospheric pressure, and a vegetable oil-modified phenol resin (B2) was then obtained as a reaction product.

Synthesis Example 5

Synthesis of Vegetable Oil-Modified Phenol Resin (B3)

100 parts by mass of phenol, 43 parts by mass of linseed oil and 0.1 part by mass of trifluoromethanesulfonic acid were mixed, and the obtained mixture was then stirred at 120° C. for 2 hours to obtain a vegetable oil-modified phenol derivative (b). Subsequently, 130 g of the vegetable oil-modified phenol derivative (b), 16.3 g of paraformaldehyde and 1.0 g of oxalic acid were mixed, and the obtained mixture was then stirred at 90° C. for 3 hours. Thereafter, the temperature of the reaction solution was increased to 120° C., the solution was then stirred under a reduced pressure for 3 hours, and 29 g of succinic anhydride and 0.3 g of triethylamine were then added to the reaction solution, followed by stirring it under an atmospheric pressure at 100° C. for 1 hour. The reaction solution was cooled to a room temperature, and a vegetable oil-modified phenol resin (B3) was obtained as a reaction product (acid value: 120 mg KOH/g).

Synthesis Example 6

Synthesis of Vegetable Oil-Modified Phenol Resin (B4)

100 parts by mass of phenol, 100 parts by mass of castor oil and 0.2 parts by mass of trifluoromethanesulfonic acid were mixed, and the obtained mixture was then stirred at 120° C. for 2 hours to obtain a vegetable oil-modified phenol derivative (c). Subsequently, 200 g of the vegetable oil-modified phenol derivative (c), 20 g of paraformaldehyde and 0.4 g of oxalic acid were mixed, and the obtained mixture was then stirred at 90° C. for 3 hours. Thereafter, the temperature of the reaction solution was increased to 120° C., the solution was then stirred under a reduced pressure for 3 hours, and 62 g of tetrahydrophthalic anhydride and 0.3 g of triethylamine were then added to the reaction solution, followed by stirring it under an atmospheric pressure at 100° C. for 1 hour. The reaction solution was cooled to a room temperature, and a vegetable oil-modified phenol resin (B4) was obtained as a reaction product (acid value: 90 mg KOH/g).

Preparation of Positive Tone Photosensitive Composition

Alkali-soluble resins A1 to A3 each having a phenolic hydroxyl group were prepared as the ingredients (A):
A1: Cresol novolac resin (cresol/formaldehyde novolac resin; m-cresol/p-cresol (molar ratio)=60/40; weight average molecular weight relative to polystyrene=7000; manufactured by Asahi Organic Chemicals Industry Co., Ltd.; trade name "EP4050G"),
A2: 4-hydroxystyrene/methyl methacrylate=50/50 (molar ratio) copolymer (weight average molecular weight relative to polystyrene=10000; manufactured by Maruzen Petrochemical Co., Ltd.; trade name "Maruka Linker CMM"), and
A3: the polybenzoxazole precursor of Synthesis Example 1.

Vegetable oil-modified phenol resins B1 to B4 were prepared as the ingredients (B):
B1: the vegetable oil-modified phenol resin of Synthesis Example 3,
B2: the vegetable oil-modified phenol resin of Synthesis Example 4,
B3: the vegetable oil-modified phenol resin of Synthesis Example 5, and
B4: the vegetable oil-modified phenol resin of Synthesis Example 6.

Compounds C1 and C2 that generate an acid by the action of light were prepared as the ingredients (C):
C1: 1-naphthoquinone-2-diazide-5-sulfonate of 1,1-bis(4-hydroxyphenyl)-1-[4-{1-(4-hydroxyphenyl)-1-methylethyl}phenyl]ethane (esterification rate: approximately 90%; manufactured by AZ Electronic Materials; trade name "TPPA528"), and
C2: 1-naphthoquinone-2-diazide-5-sulfonate of tris(4-hydroxyphenyl)methane (esterification rate: approximately 95%).

Thermal cross-linkers D1 to D4 were prepared as the ingredients (D):
D1: 1,1-bis{3,5-bis(methoxymethyl)-4-hydroxyphenyl}methane (manufactured by Honshu Chemical Industry Co., Ltd.; trade name "TMOM-pp-BPF"),
D2: 2,2-bis[3,5-bis(hydroxymethyl)-4-hydroxyphenyl]propane (manufactured by Honshu Chemical Industry Co., Ltd.; trade name "TML-BPA"),
D3: hexakis(methoxymethyl)melamine (manufactured by Sanwa Chemical Co., Ltd.; trade name "NIKALAC MW-30HM"), and
D4: N,N',N'',N''-tetrakis(methoxymethyl)glycoluril (manufactured by Sanwa Chemical Co., Ltd.; trade name "NIKALAC MX-270").

Solvents E1 and E2 were prepared as the ingredients (E):
E1: γ-butyrolactone/propylene glycol monomethyl ether acetate=90/10 (mass ratio), and
E2: ethyl lactate.

Elastomer F1 was prepared as the ingredient (F).
F1: butadiene-styrene-methacrylate copolymer (manufactured by Rohm and Haas Company; trade name "Paraloid EXL2655").

Examples 1 to 14

The ingredients (A) to (F) were mixed at the predetermined ratios shown in Table 1, and 2 parts by mass of a 50% methanol solution of urea propyltriethoxysilane was further mixed therewith as a coupling agent (an adhesion aid). The obtained solutions were each subjected to pressure filtration using Teflon (registered trademark) with a pore size of 3 μm, so as to prepare solutions of the positive tone photosensitive compositions (M1 to M14) of Examples 1 to 14.

Comparative Examples 1 to 3

The alkali-soluble resin (A4) having no phenolic hydroxyl groups of Synthetic Example 2 was prepared as the ingredient (A), and the ingredients (A) to (E) were mixed at the predetermined ratios shown in Table 1, and 2 parts by mass of a 50% methanol solution of urea propyltriethoxysilane was further mixed therewith as a coupling agent (an adhesion aid). The obtained solutions were each subjected to pressure filtration using Teflon (registered trademark) with a pore size of 3 μm, so as to prepare solutions of the positive tone photosensitive compositions (M15 to M17) of Comparative Examples 1 to 3. In the table, the numerical value in the parentheses indicates part by mass.

TABLE 1

|  | Photosensitive composition | Ingredient (A) | Ingredient (B) | Ingredient (C) | Ingredient (D) | Ingredient (E) | Ingredient (F) |
|---|---|---|---|---|---|---|---|
| Ex. 1 | M1 | A1 (50) | B1 (50) | C1 (15) | D2 (15) | E1 (190) | None |
| Ex. 2 | M2 | A1 (50) | B1 (50) | C2 (15) | D3 (15) | E2 (180) | None |

TABLE 1-continued

| | Photosensitive composition | Ingredient (A) | Ingredient (B) | Ingredient (C) | Ingredient (D) | Ingredient (E) | Ingredient (F) |
|---|---|---|---|---|---|---|---|
| Ex. 3 | M3 | A1 (40) | B2 (60) | C1 (15) | D3 (15) | E2 (180) | None |
| Ex. 4 | M4 | A1 (80) | B2 (20) | C2 (15) | D1 (15) | E1 (180) | F1 (10) |
| Ex. 5 | M5 | A1 (60) | B3 (40) | C1 (15) | D1 (15) | E1 (180) | None |
| Ex. 6 | M6 | A1 (90) | B3 (10) | C2 (15) | D4 (15) | E2 (180) | None |
| Ex. 7 | M7 | A1 (50) | B3 (50) | C2 (15) | D4 (15) | E2 (180) | None |
| Ex. 8 | M8 | A1 (10) | B3 (90) | C2 (15) | D4 (15) | E2 (180) | None |
| Ex. 9 | M9 | A1 (70) | B3 (30) | C1 (15) | D3 (15) | E2 (180) | None |
| Ex. 10 | M10 | A1 (20) | B4 (80) | C1 (15) | D1 (15) | E1 (175) | None |
| Ex. 11 | M11 | A1 (50) | B4 (50) | C1 (15) | D3 (15) | E2 (180) | None |
| Ex. 12 | M12 | A2 (50) | B4 (50) | C2 (20) | D4 (20) | E2 (180) | None |
| Ex. 13 | M13 | A2 (40) | B3 (60) | C1 (20) | D1 (20) | E1 (190) | F1 (10) |
| Ex. 14 | M14 | A3 (30) | B1 (70) | C1 (10) | D2 (10) | E1 (175) | None |
| Com. Ex. 1 | M15 | A1 (100) | None | C1 (10) | D1 (15) | E1 (185) | None |
| Com. Ex. 2 | M16 | None | B4 (100) | C2 (15) | D3 (15) | E2 (180) | None |
| Com. Ex. 3 | M17 | A4 (75) | B2 (25) | C1 (20) | D2 (15) | E1 (200) | None |

Evaluation of Positive Tone Photosensitive Compositions (Photosensitive Properties)

The solutions of the positive tone photosensitive compositions (M1 to M17) obtained in Examples 1 to 14 and Comparative Examples 1 to 3 were each spin-coated onto a silicon substrate, and it was then heated at 120° C. for 3 minutes, so as to form a coating film with a film thickness of 11 to 13 μm. Subsequently, using an i-line stepper (manufactured by Canon Inc.; trade name "FPA-300iW"), reduced projection exposure was carried out with i-line (365 nm) via a mask. After completion of the light exposure, the positive tone photosensitive composition was developed with an aqueous solution of 2.38% tetramethylammonium hydroxide (TMAH). The thickness of a remaining film after the development was approximately 80% to 99% of the initial film thickness. Thereafter, the resin composition was rinsed with water, and the minimal light exposure amount necessary for the formation of a pattern and the size of the smallest square hole pattern opened were then obtained. The minimal light exposure amount was used as an indicator for sensitivity, and the smallest square hole pattern opened was used as an indicator for resolution. In addition, the presence or absence of cracks generated at the corners of the square hole patterns was confirmed. The results are shown in Table 2.

TABLE 2

| | Photosensitive composition | Film retention (%) | Sensitivity (mJ/cm$^2$) | Resolution (μm) | Presence of cracks |
|---|---|---|---|---|---|
| Ex. 1 | M1 | 94 | 420 | 8 | No |
| Ex. 2 | M2 | 95 | 440 | 8 | No |
| Ex. 3 | M3 | 95 | 450 | 10 | No |
| Ex. 4 | M4 | 97 | 500 | 5 | No |
| Ex. 5 | M5 | 95 | 380 | 8 | No |
| Ex. 6 | M6 | 98 | 360 | 5 | No |
| Ex. 7 | M7 | 95 | 390 | 8 | No |
| Ex. 8 | M8 | 92 | 450 | 10 | No |
| Ex. 9 | M9 | 96 | 380 | 5 | No |
| Ex. 10 | M10 | 90 | 500 | 8 | No |
| Ex. 11 | M11 | 92 | 380 | 8 | No |
| Ex. 12 | M12 | 90 | 600 | 10 | No |
| Ex. 13 | M13 | 90 | 590 | 10 | No |
| Ex. 14 | M14 | 85 | 350 | 5 | No |
| Com. Ex. 1 | M15 | 99 | 500 | 5 | No |
| Com. Ex. 2 | M16 | 85 | 490 | 15 | Yes |
| Com. Ex. 3 | M17 | 80 | 800 | 20 | No |

Patterning of Samples Used for Measurement of Physical Properties of Cured Films The solutions of the positive tone photosensitive compositions (M1 to M17) obtained in Examples 1 to 14 and Comparative Examples 1 to 3 were each spin-coated onto a silicon substrate, and it was then heated at 120° C. for 3 minutes, so as to form a coating film with a film thickness of approximately 12 to 14 μm. Subsequently, using a proximity light exposure device (manufactured by Canon Inc.; trade name "PLA-600FA"), the coating films of the resins M1 to M17 were subjected to light exposure at all wavelengths via a mask. After completion of the light exposure, the positive tone photosensitive composition was developed with an aqueous solution of 2.38% TMAH, so as to obtain a rectangular pattern with a width of 10 mm. Thereafter, the rectangular pattern was subjected to a heat treatment (hardening) by the method (i) or (ii) as described below, so as to obtain a cured film with a film thickness of 10 μm. Hardening conditions and the contraction percentage of a film thickness before and after the hardening operation (=[1−(film thickness after hardening/film thickness before hardening)]×100) [%] are shown in Table 3.

(i) Using a vertical diffusion furnace (manufactured by Koyo Thermo System Co., Ltd.; trade name "μ-TF"), the coating film is subjected to a heat treatment in a nitrogen atmosphere at a temperature of 175° C. (temperature rise time: 1.5 hours) for 2 hours.

(ii) Using a frequency-changeable microwave curing furnace (manufactured by Lambda Technology; trade name "Microcure 2100"), the coating film was subjected to a heat treatment at a microwave output of 450 W, at a microwave frequency of 5.9 to 7.0 GHz, at a temperature of 165° C. (temperature rise time: 5 minutes) for 2 hours.

Physical Properties of Cured Films

A cured film with a film thickness of approximately 10 μm, which had been obtained in the above section "Patterning of samples used for measurement of physical properties of cured films," was removed from the silicon substrate, and the glass transition temperature (Tg) of the removed film was then measured using "TMA/SS600" manufactured by Seiko Instruments Inc. During the measurement, the width of the sample was 2 mm, the film thickness thereof was 9 to 11 μm, and the space between chucks was set at 10 mm. The load was 10 g, and the temperature rise rate was 5° C./min. Moreover, the mean fracture elongation (EL) of the removed film was measured using "Autograph AGS-H100N" manufactured by Shimadzu Corporation. The width of the sample was 10 mm, the film thickness thereof was 9 to 11 μm, and the space between chucks was set at 20 mm. The tensile strength was set at 5 mm/min, and the measurement temperature was set around a room temperature (20° C. to 25° C.). The mean value of the measurement values of 5 or more test pieces obtained from cured films produced under the same conditions was defined as a "mean fracture elongation (EL)." The measured Tg and EL are shown in Table 3.

TABLE 3

| | Photosensitive composition | Curing condition | Shrinkage percentage (%) | Tg (° C.) | EL (%) |
|---|---|---|---|---|---|
| Ex. 1 | M1 | i | 9 | 195 | 13 |
| | | ii | 10 | 196 | 12 |
| Ex. 2 | M2 | i | 10 | 192 | 14 |
| Ex. 3 | M3 | i | 10 | 188 | 9 |
| Ex. 4 | M4 | i | 8 | 200 | 8 |
| Ex. 5 | M5 | i | 11 | 191 | 11 |
| Ex. 6 | M6 | i | 9 | 198 | 10 |
| Ex. 7 | M7 | i | 12 | 193 | 12 |
| Ex. 8 | M8 | i | 15 | 187 | 15 |
| Ex. 9 | M9 | i | 11 | 190 | 10 |
| Ex. 10 | M10 | i | 15 | 187 | 12 |
| Ex. 11 | M11 | i | 13 | 184 | 10 |
| Ex. 12 | M12 | i | 14 | 185 | 6 |
| Ex. 13 | M13 | i | 13 | 188 | 5 |
| Ex. 14 | M14 | i | 20 | 196 | 18 |
| Com. Ex. 1 | M15 | i | 8 | Immeasurable | 1 |
| Com. Ex. 2 | M16 | i | 15 | 184 | 15 |
| Com. Ex. 3 | M17 | i | 25 | 185 | 20 |

Measurement of Dielectric Constant

The solutions of the positive tone photosensitive compositions (M1 to M17) obtained in Examples 1 to 14 and Comparative Examples 1 to 3 were each spin-coated onto a low-resistance silicon substrate, and it was then heated at 120° C. for 3 minutes, so as to form a coating film with a film thickness of approximately 11 μm. The coating film on the substrate was hardened by the method (i) or (ii) as described above. Subsequently, an aluminum electrode with a diameter of 2 mm was formed on the cured film using a vacuum deposition equipment. Thereafter, there was used a measurement apparatus, in which Test Fixture HP16451 used as a dielectric substance manufactured by Yokogawa Electric Corporation was connected with LF Impedance Analyzer HP4192A manufactured by Yokogawa Electric Corporation, and the charge capacity between the aluminum electrode and the silicon substrate was measured. The measurement environment consisted of a room temperature (20° C. to 25° C.), a humidity of 40% to 50% RH, a measurement frequency of 10 kHz, and a bias voltage of −35 V. The relative dielectric constant of the cured film was obtained based on the measured charge capacity of the electrode and the thickness value of the film in the neighborhood of the electrode. The results are shown in Table 4.

Evaluation of Adhesion (Stud Pull Test)

The solutions of the positive tone photosensitive compositions (M1 to M17) obtained in Examples 1 to 14 and Comparative Examples 1 to 3 were each spin-coated onto a substrate (which had been obtained by forming TiN on a silicon substrate by sputtering and then further forming copper on the TiN by sputtering), and it was then heated at 120° C. for 3 minutes, so as to form a coating film with a film thickness of approximately 12 to 14 μm. This coating film was hardened by the method (i) or (ii) as described above, so as to obtain a cured film with a film thickness of approximately 10 μm. This cured film, together with the substrate, was cut into small pieces, and an aluminum stud was then conjugated with the cured film via an epoxy resin layer. Subsequently, the stud was pulled, and the load during peeling was measured. The results are shown in Table 4.

Evaluation of Thermal Shock Resistance (Temperature Cycle Test)

The solutions of the positive tone photosensitive compositions (M1 to M17) obtained in Examples 1 to 14 and Comparative Examples 1 to 3 were each spin-coated onto a substrate, on which rewiring had been formed, and it was then heated at 120° C. for 3 minutes, so as to form a coating film with a film thickness of approximately 20 μm. Using a proximity light exposure device (manufactured by Canon Inc.; trade name "PLA-600FA"), light was exposed to this coating film at all wavelengths via a mask (800 mJ/cm$^2$). After completion of the light exposure, the positive tone photosensitive composition was developed with an aqueous solution of 2.38% TMAH, and the obtained coating film, on which a 200-μm square via hole was formed, was then hardened by the method (i) or (ii) as described above, so as to prepare a cover coating film. After an under barrier metal had been formed at the aperture, a solder ball was bumped, and a test component having the same wiring structure as that of the semiconductor device as shown in FIG. 7 was produced. Furthermore, the test component was mounted and sealed, so as to obtain a test sample. A temperature cycle test (−55° C. to 125° C., 1000 cycles) was performed on the test sample, and the presence or absence of defects, such as cracks or peeling, was observed. The results are shown in Table 4.

TABLE 4

| | Photosensitive composition | Curing condition | Dielectric constant measurement Relative dielectric constant (—) | Stud pull test Load (kgf/cm$^2$) | Temperature cycle test Presence of defects |
|---|---|---|---|---|---|
| Ex. 1 | M1 | I | 3.5 | 410 | No |
| | | ii | 3.5 | 430 | No |
| Ex. 2 | M2 | i | 3.4 | 420 | No |
| Ex. 3 | M3 | i | 3.4 | 450 | No |
| Ex. 4 | M4 | i | 3.8 | 400 | No |
| Ex. 5 | M5 | i | 3.5 | 410 | No |
| Ex. 6 | M6 | i | 3.8 | 400 | No |
| Ex. 7 | M7 | i | 3.7 | 450 | No |
| Ex. 8 | M8 | i | 3.8 | 430 | No |
| Ex. 9 | M9 | i | 3.6 | 440 | No |
| Ex. 10 | M10 | i | 3.6 | 400 | No |
| Ex. 11 | M11 | i | 3.5 | 430 | No |
| Ex. 12 | M12 | i | 2.9 | 380 | No |
| Ex. 13 | M13 | i | 2.9 | 400 | No |
| Ex. 14 | M14 | i | 3.5 | 410 | No |
| Com. Ex. 1 | M15 | i | 3.8 | 290 | Yes |
| Com. Ex. 2 | M16 | i | 3.4 | 400 | No |
| Com. Ex. 3 | M17 | i | 3.6 | 350 | No |

(1 kgf/cm$^2$ = 0.1 MPa)

As is clear from Table 2, it is found that the sensitivity and resolution of the positive tone photosensitive compositions M1 to M14 of Examples 1 to 14 is comparable to the positive tone photosensitive compositions M15 to M17 of Comparative Examples 1 to 3, and thus that the sensitivity and resolution are sufficiently high. In addition, as is clear from Table 3, the cured films formed from the positive tone photosensitive compositions M1 to M13 of Examples 1 to 13 each exhibited a low contraction percentage of 15% or less. In the case of the cured film formed from the positive tone photosensitive composition M14 of Example 14, in which poly(hydroxyamide) was used as the ingredient (A), since the removal of water caused by a ring closure reaction occurred during hardening, its contraction percentage was 20%. If the cure shrinkage is large, residual stress tends to become large, or the flatness of the cured film tends to decrease.

As is clear from Table 3, even after the positive tone photosensitive compositions M1 to M14 of Examples 1 to 14 had been hardened at 175° C., they exhibited good Tg (184° C. or more) and good EL (5% or more). When the positive tone photosensitive composition M1 of Example 1 was hardened with a microwave at 165° C. (hardening condition ii), it exhibited Tg and EL that were almost equivalent to those obtained by thermal hardening at 175° C. (hardening condition i), and thus, it was confirmed that it is possible to carry out a hardening operation at a lower temperature.

As is clear from Table 4, the positive tone photosensitive compositions M12 and M13 of Examples 12 and 13, in which poly(hydroxystyrene) was used as the ingredient (A), had sensitivity and EL that were lower than those of the positive tone photosensitive compositions M1 to M11 and M14 of Examples 1 to 11 and Example 14. However, the relative dielectric constants of the cured films were good, and they were 3 or less. Furthermore, from the results of the stud pull test and the temperature cycle test, it was confirmed that the cured films of the positive tone photosensitive compositions M1 to M14 of Examples 1 to 14 had high adhesiveness (adhesion) to copper (380 kgf/cm$^2$ or more). Further, since their thermal shock resistance was also high, defects such as cracks or peeling were not found on the test samples after completion of the temperature cycle test.

On the other hand, in the case of the positive tone photosensitive composition M15 of Comparative Example 1, which did not contain a vegetable oil-modified phenol resin as the ingredient (B), its sensitivity and resolution were high, and the contraction percentage of the cured film thereof was low, but the EL of the cured film was low and it was 1%, and thus, since it was fragile, its Tg could not be measured. In addition, the adhesion of the resist pattern thereof to copper and thermal shock resistance were also low.

The positive tone photosensitive composition M16 of Comparative Example 2, which did not contain an alkali-soluble resin having a phenolic hydroxyl group as the ingredient (A), had high sensitivity and high resolution, but minute cracks were generated at the corners of a square hole pattern. Moreover, the positive tone photosensitive composition M17 of Comparative Example 3, in which polyamic acid (a polyimide precursor) that was an alkali-soluble resin having no phenolic hydroxyl groups was used as the ingredient (A), had low sensitivity and low resolution.

REFERENCE SIGNS LIST

1 . . . semiconductor substrate, 2 . . . protective film, 3 . . . first conductor layer, 4 . . . interlayer dielectric film, 5 . . . photosensitive resin layer, 6A, 6B and 6C . . . window portions, 7 . . . second conductor layer, 8 . . . surface-protective layer, 11 . . . interlayer dielectric layer, 12 . . . wiring layer, 13 . . . insulation layer, 14 . . . surface-protective layer, 15 . . . pad portion, 16 . . . redistribution layer, 17 . . . conductive ball, 18 . . . core, 19 . . . cover coating layer, 20 . . . barrier metal, 21 . . . collar, 22 . . . underfill, 23 . . . silicon chip, 24 . . . connection, 100, 200, 300 and 400 . . . structures, 500 . . . semiconductor device, 600 . . . semiconductor device, 700 . . . semiconductor device.

The invention claimed is:

1. A positive tone photosensitive composition comprising:
(A) an alkali-soluble resin having a phenolic hydroxyl group;
(B) a phenol resin modified by a compound having an unsaturated hydrocarbon group containing 4 to 100 carbon atoms;
(C) a compound that generates an acid by the action of light;
(D) a thermal cross-linker; and
(E) a solvent.

2. The positive tone photosensitive composition according to claim 1, wherein the ingredient (A) is a phenol resin.

3. The positive tone photosensitive composition according to claim 1, wherein the ingredient (A) is a vinyl polymer containing a monomer unit having a phenolic hydroxyl group.

4. The positive tone photosensitive composition according to claim 1, wherein the ingredient (B) is further modified by the reaction of the phenolic hydroxyl group with a polybasic acid anhydride.

5. The positive tone photosensitive composition according to claim 1, wherein the mass ratio between the ingredient (A) and the ingredient (B) is from 5:95 to 95:5, based on the total amount of the ingredients (A) and (B) that is defined as 100.

6. The positive tone photosensitive composition according to claim 1, wherein the ingredient (C) is an o-quinone diazide compound.

7. The positive tone photosensitive composition according to claim 1, comprising 3 to 100 parts by mass of the ingredient (C), with respect to the total amount of the ingredients (A) and (B) that is defined as 100 parts by mass.

8. The positive tone photosensitive composition according to claim 1, further comprising an elastomer (F).

9. A method for producing a resist pattern, the method comprising the steps of:
exposing a photosensitive resin film formed by drying the positive tone photosensitive composition according to claim 1 to light;
developing the photosensitive resin film obtained after completion of the exposure in an alkaline aqueous solution to form a resist pattern; and
heating the resist pattern.

10. The method for producing a resist pattern according to claim 9, wherein the resist pattern is heated at 200° C. or less.

11. An electronic component having a resist pattern formed by the method for producing a resist pattern according to claim 9 as an interlayer dielectric layer or a surface-protective layer.

12. An electronic component having a resist pattern formed by the method for producing a resist pattern according to claim 9 as a cover coating layer.

13. An electronic component having a resist pattern formed by the method for producing a resist pattern according to claim 9 as a core used for a redistribution layer.

14. An electronic component having a resist pattern formed by the method for producing a resist pattern according to claim 9 as a collar for holding a conductive ball that is an external connection terminal.

15. An electronic component having a resist pattern formed by the method for producing a resist pattern according to claim 9 as an underfill.

* * * * *